United States Patent
Natanzon

(10) Patent No.: US 7,719,443 B1
(45) Date of Patent: May 18, 2010

(54) COMPRESSING DATA IN A CONTINUOUS DATA PROTECTION ENVIRONMENT

(75) Inventor: Assaf Natanzon, Ramat-Gan (IL)

(73) Assignee: EMC Corporation, Hopkinton, MA (US)

( * ) Notice: Subject to any disclaimer, the term of this patent is extended or adjusted under 35 U.S.C. 154(b) by 27 days.

(21) Appl. No.: 12/147,835

(22) Filed: Jun. 27, 2008

(51) Int. Cl.
*H03M 7/34* (2006.01)

(52) U.S. Cl. .......................................... 341/51; 341/50

(58) Field of Classification Search ................ 341/50, 341/51; 348/207.99; 710/68; 375/240.02
See application file for complete search history.

(56) References Cited

U.S. PATENT DOCUMENTS

| | | | |
|---|---|---|---|
| 5,170,480 A | 12/1992 | Mohan et al. | |
| 5,249,053 A * | 9/1993 | Jain | 348/207.99 |
| 5,864,837 A | 1/1999 | Maimone | |
| 5,879,459 A | 3/1999 | Gadgil et al. | |
| 6,042,652 A | 3/2000 | Hyun et al. | |
| 6,143,659 A | 11/2000 | Leem | |
| 6,148,340 A | 11/2000 | Bittinger et al. | |
| 6,174,377 B1 | 1/2001 | Doering et al. | |
| 6,174,809 B1 | 1/2001 | Kang et al. | |
| 6,203,613 B1 | 3/2001 | Gates et al. | |
| 6,260,125 B1 | 7/2001 | McDowell | |
| 6,270,572 B1 | 8/2001 | Kim et al. | |
| 6,272,534 B1 | 8/2001 | Guha | |
| 6,287,965 B1 | 9/2001 | Kang et al. | |
| 6,574,657 B1 | 6/2003 | Dickinson | |
| 6,947,981 B2 | 9/2005 | Lubbers et al. | |
| 7,051,126 B1 * | 5/2006 | Franklin | 710/68 |
| 7,111,197 B2 | 9/2006 | Kingsbury et al. | |
| 7,117,327 B2 | 10/2006 | Hirakawa et al. | |
| 7,130,975 B2 | 10/2006 | Suishu et al. | |
| 7,139,927 B2 | 11/2006 | Park et al. | |
| 7,159,088 B2 | 1/2007 | Hirakawa et al. | |
| 7,167,963 B2 | 1/2007 | Hirakawa et al. | |
| 7,328,373 B2 | 2/2008 | Kawamura et al. | |
| 2002/0129168 A1 | 9/2002 | Kanai et al. | |
| 2003/0048842 A1 * | 3/2003 | Fourquin et al. | 375/240.02 |
| 2003/0110278 A1 | 6/2003 | Anderson | |
| 2004/0250032 A1 | 12/2004 | Ji et al. | |
| 2005/0015663 A1 | 1/2005 | Armangau et al. | |
| 2005/0273655 A1 | 12/2005 | Chow et al. | |
| 2006/0107007 A1 | 5/2006 | Hirakawa et al. | |
| 2006/0117211 A1 | 6/2006 | Matsunami et al. | |
| 2006/0212462 A1 | 9/2006 | Heller et al. | |
| 2007/0162513 A1 | 7/2007 | Lewin et al. | |
| 2007/0220311 A1 | 9/2007 | Lewin et al. | |

(Continued)

OTHER PUBLICATIONS

Yair Heller, et al.; "Apparatus For Continuous Compression Of Large Volumes Of Data," U.S. Appl. No. 60/375,007, filed Apr. 25, 2002.

(Continued)

*Primary Examiner*—Jean B Jeanglaude
(74) *Attorney, Agent, or Firm*—Daly, Crowley, Mofford & Durkee, LLP

(57) ABSTRACT

In one aspect, a method to compress data includes compressing data using a first algorithm to form compressed data, determining a compression ratio of the data with respect to the compressed data, determining if the compression ratio is greater than a compression threshold and compressing the compressed data using a second algorithm if the compression ratio is greater than the compression threshold. The second algorithm takes longer to compress data than the first algorithm.

19 Claims, 21 Drawing Sheets

U.S. PATENT DOCUMENTS

| | | |
|---|---|---|
| 2007/0266053 A1 | 11/2007 | Ahal et al. |
| 2008/0082591 A1 | 4/2008 | Ahal et al. |
| 2008/0082592 A1 | 4/2008 | Ahal et al. |
| 2008/0082770 A1 | 4/2008 | Ahal et al. |

OTHER PUBLICATIONS

Shlomo Ahal; "Multiple Points In Time Data Access," U.S. Appl. No. 60/753,263, filed Dec. 22, 2005.

Michael Lewin; "Any Point in Time Data Access and Recovery;" U.S. Appl. No. 60/752,665, filed Dec. 21, 2005.

Assaf Natanzon, "Methods And Apparatus For Volume Synchronization", U.S. Appl. No. 12/045,946, filed Mar. 11, 2008.

PAIR file for U.S. Appl. No. 11/609,560, filed Dec. 12, 2006, file through Jan. 13, 2009, 443 pages.

PAIR file for U.S. Appl. No. 11/536,215, filed Sep. 28, 2006, file through Jan. 13, 2009, 145 pages.

PAIR file for U.S. Appl. No. 11/536,233, filed Sep. 28, 2006, file through Jan. 13, 2009, 142 pages.

PAIR file for U.S. Appl. No. 12/045,946, filed Mar. 11, 2008, file through Jan. 13, 2009, 118 pages.

PAIR file for U.S. Appl. No. 60/752,665, filed Dec. 21, 2005, file through Jan. 13, 2009, 61 pages.

PAIR file for U.S. Appl. No. 10/512,687, filed Aug. 24, 2005 file through Jan. 26, 2009, 301 pages.

PAIR file for U.S. Appl. No. 11/536,160, filed Sep. 28, 2006, file through Jan. 14, 2009, 116 pages.

Retrieved from http://en.wikipedia.org/wiki/DEFLATE Deflate, Jun. 19, 2008, pp. 1-4.

Retrieved from http://en.wikipedia.org/wiki/Huffman_coding Huffman Coding, Jun. 8, 2008, pp. 1-6.

Retrieved from http:///en.wikipedia.org/wiki/LZ77_and_LZ78, LZ77 and LZ78, Jun. 17, 2008, pp. 1-2.

* cited by examiner

JOURNAL VOLUME SEGMENTS AT STAGE 3

| BLOCK NO. → | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| SEGMENT #1 | SEGMENT #1 HAS BEEN FREED ||||||||||||||||||||
| SEGMENT #2 | | | ID=3: 1 BLOCK OF DO METADATA ||||||||||||||||||
| SEGMENT #3 | ID=3: 15 BLOCKS OF DO DATA ||||||||||||||||||||
| SEGMENT #4 | | | | | | | | | | | | | | | | ID=3: 5 BLOCKS OF DO DATA |||||
| SEGMENT #5 | ID=1: 15 BLOCKS OF UNDO DATA ||||||||||||||||||||
| SEGMENT #6 | ID=1: 1 BLOCK OF UNDO METADATA | ID=2: 1 BLOCK OF UNDO METADATA | | | | | | | | | | | | | | ID=2: 5 BLOCKS OF UNDO DATA |||||
| SEGMENT #7 | ID=2: 15 BLOCKS OF UNDO DATA ||||||||||||||||||||

THE FOUR STREAMS

DO STREAM INCLUDES SEGMENTS #3 AND #4, BEGINS AT SEGMENT #3, BLOCK #15 AND ENDS AT SEGMENT #3, BLOCK #5
DO METADATA STREAM INCLUDES SEGMENT #2, BEGINS AT SEGMENT #2, BLOCK #2 AND ENDS AT SEGMENT #2, BLOCK #3
UNDO STREAM INCLUDES SEGMENT #5 AND #7, BEGINS AT SEGMENT #5, BLOCK #0 AND ENDS AT SEGMENT #7, BLOCK #15
UNDO METADATA STREAM INCLUDES SEGMENT #6, BEGINS AT SEGMENT #6, BLOCK #0 AND ENDS AT SEGMENT #6, BLOCK #2

*FIG. 3C*

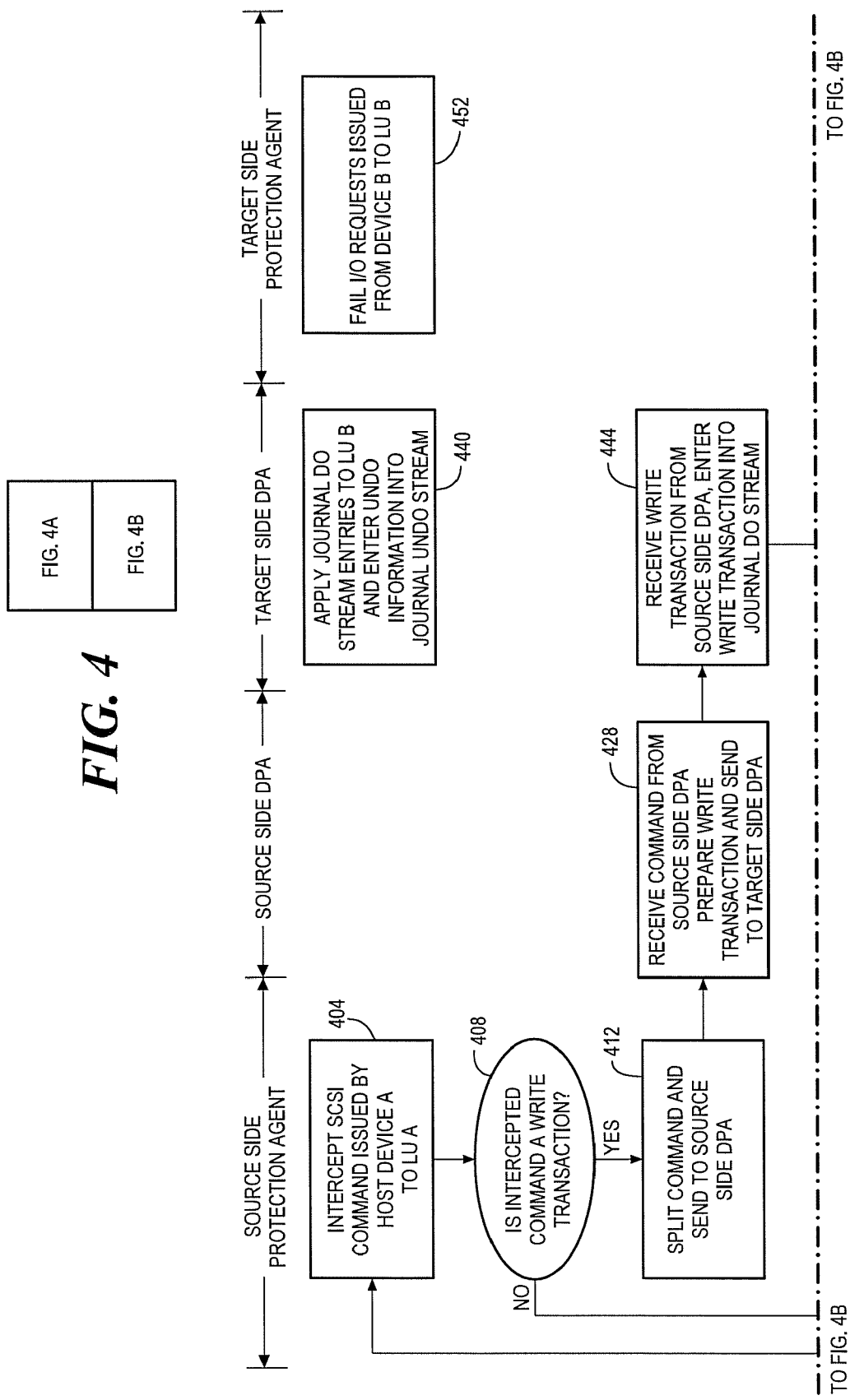

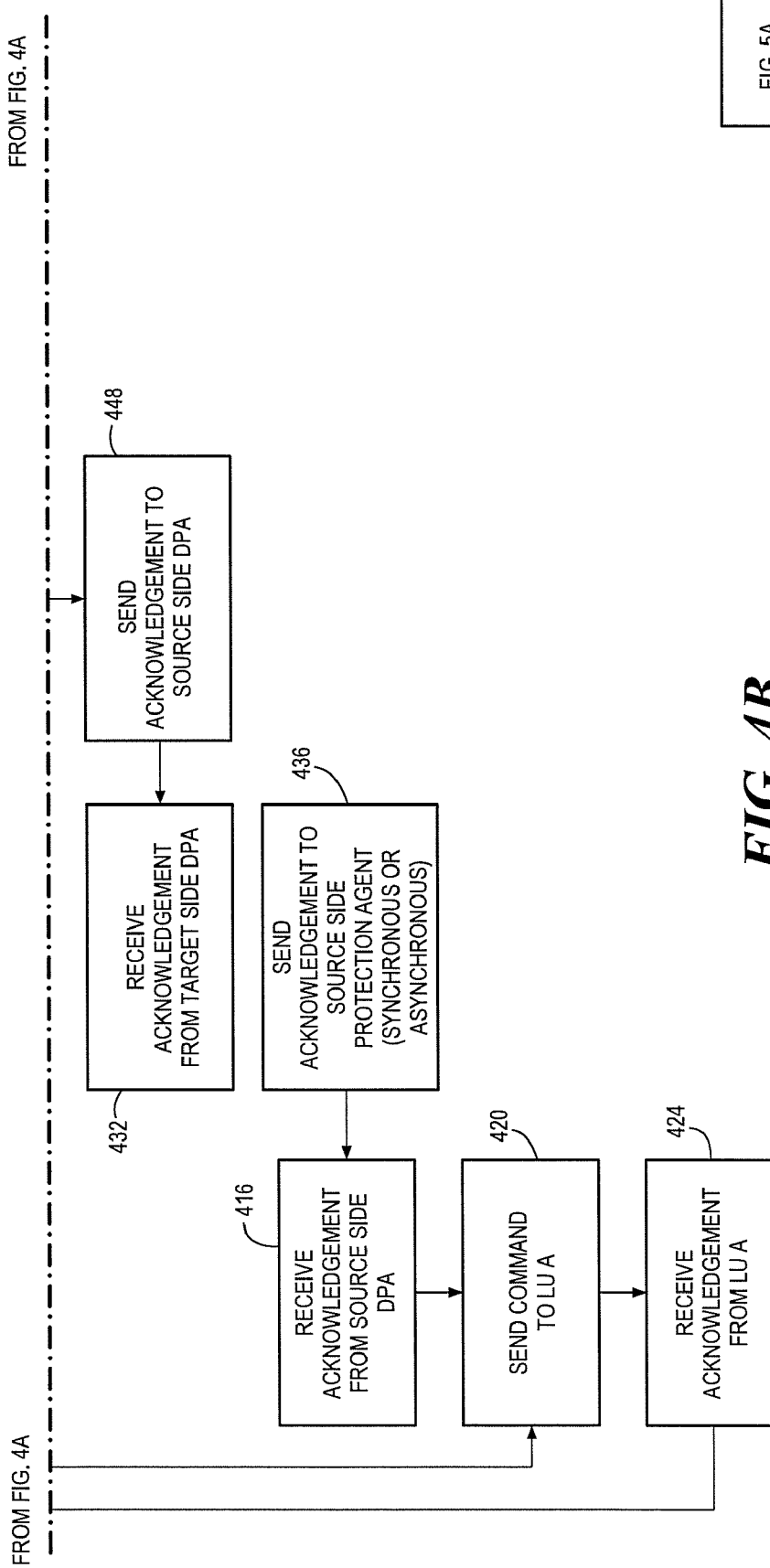

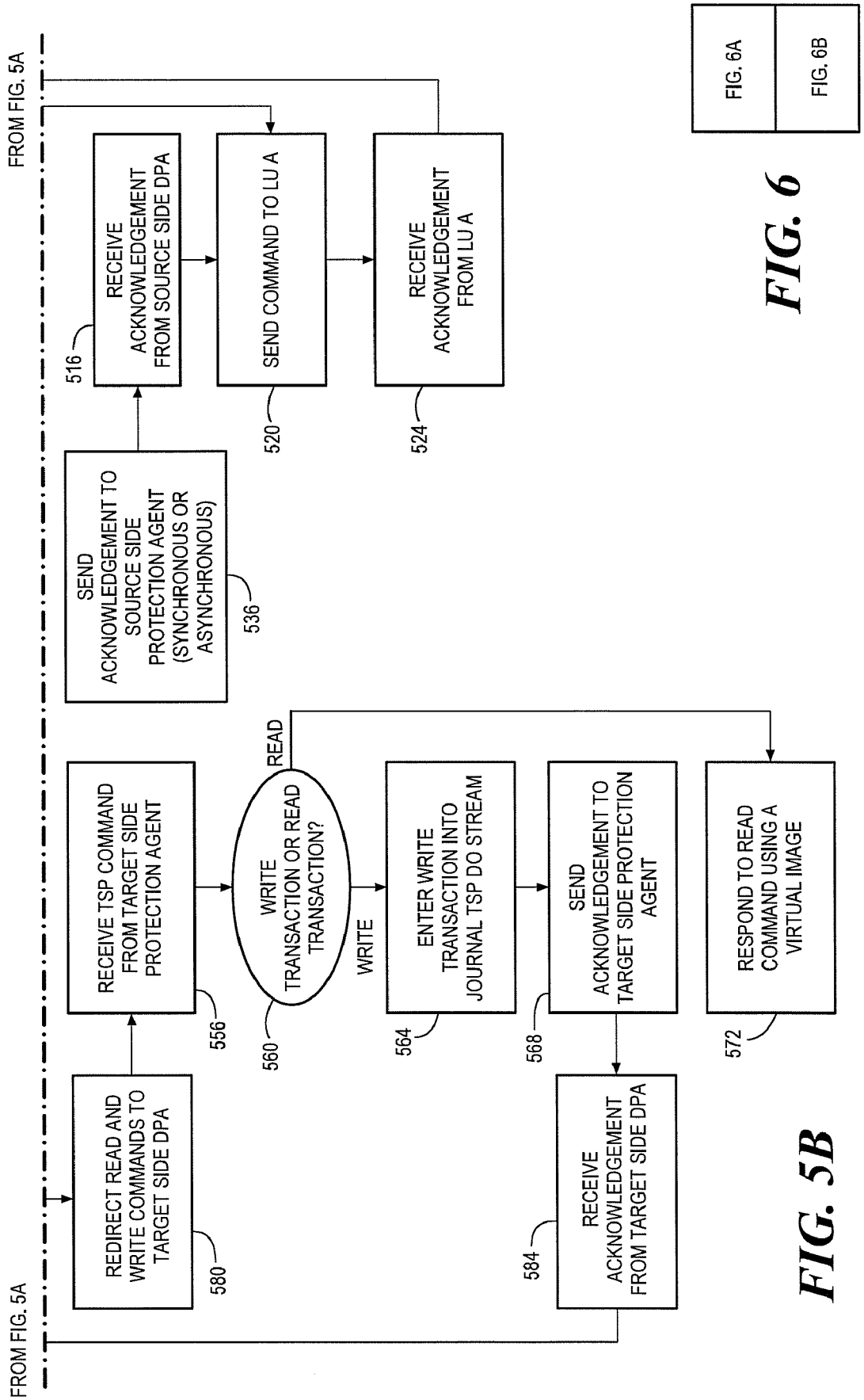

COMPRESSING DATA IN A CONTINUOUS DATA PROTECTION ENVIRONMENT

BACKGROUND

Computer data is vital to today's organizations, and a significant part of protection against disasters is focused on data protection. As solid-state memory has advanced to the point where cost of memory has become a relatively insignificant factor, organizations can afford to operate with systems that store and process terabytes of data.

Conventional data protection systems include tape backup drives, for storing organizational production site data on a periodic basis. Such systems suffer from several drawbacks. First, they require a system shutdown during backup, since the data being backed up cannot be used during the backup operation. Second, they limit the points in time to which the production site can recover. For example, if data is backed up on a daily basis, there may be several hours of lost data in the event of a disaster. Third, the data recovery process itself takes a long time.

Another conventional data protection system uses data replication, by creating a copy of the organization's production site data on a secondary backup storage system, and updating the backup with changes. The backup storage system may be situated in the same physical location as the production storage system, or in a physically remote location. Data replication systems generally operate either at the application level, at the file system level, or at the data block level.

Current data protection systems try to provide continuous data protection, which enable the organization to roll back to any specified point in time within a recent history. Continuous data protection systems aim to satisfy two conflicting objectives, as best as possible; namely, (i) minimize the down time, in which the organization production site data is unavailable, during a recovery, and (ii) enable recovery as close as possible to any specified point in time within a recent history.

Continuous data protection typically uses a technology referred to as "journaling," whereby a log is kept of changes made to the backup storage. During a recovery, the journal entries serve as successive "undo" information, enabling rollback of the backup storage to previous points in time. Journaling was first implemented in database systems, and was later extended to broader data protection.

One challenge to continuous data protection is the ability of a backup site to keep pace with the data transactions of a production site, without slowing down the production site. The overhead of journaling inherently requires several data transactions at the backup site for each data transaction at the production site. As such, when data transactions occur at a high rate at the production site, the backup site may not be able to finish backing up one data transaction before the next production site data transaction occurs. If the production site is not forced to slow down, then necessarily a backlog of un-logged data transactions may build up at the backup site. Without being able to satisfactorily adapt dynamically to changing data transaction rates, a continuous data protection system chokes and eventually forces the production site to shut down.

SUMMARY

In one aspect, a method to compress data includes compressing data using a first algorithm to form compressed data, determining a compression ratio of the data with respect to the compressed data, determining if the compression ratio is greater than a compression threshold and compressing the compressed data using a second algorithm if the compression ratio is greater than the compression threshold. The second algorithm takes longer to compress data than the first algorithm.

In another aspect, an apparatus to compress data includes circuitry to compress data using a first algorithm to form compressed data, determine a compression ratio of the data with respect to the compressed data, determine if the compression ratio is greater than a compression threshold and compress the compressed data using a second algorithm if the compression ratio is greater than a compression threshold. The second algorithm takes longer to compress data than the first algorithm. The circuitry to compress data using a first algorithm includes circuitry to compress data using a first algorithm that searches for repeats in the data stream which are greater than a first repeat threshold. The circuitry to compress the compressed data using a second algorithm includes circuitry to compress the compressed data using a second algorithm that searches for repeats of any length in any alignment location.

In a further aspect, an article includes a machine-readable medium that stores executable instructions to compress data in a data protection environment. The instructions cause a machine to compress data using a first algorithm to form compressed data, determine a compression ratio of the data with respect to the compressed data, determine if the compression ratio is greater than a compression threshold of 2 and compress the compressed data using a second algorithm if the compression ratio is greater than 2. The second algorithm takes longer to compress data than the first algorithm. The instructions causing a machine to compress data using a first algorithm includes instructions causing a machine to compress data using a first algorithm that searches for repeats in the data stream which are greater than a first repeat threshold. The instructions causing a machine to compress the compressed data using a second algorithm includes instructions causing a machine to compress the compressed data using a second algorithm that searches for repeats of any length in any alignment location.

BRIEF DESCRIPTION OF THE DRAWINGS

The present invention will be more fully understood and appreciated from the following detailed description, taken in conjunction with the drawings.

FIG. 3C is a simplified illustration of a third stage of a journal history and four data streams stored therein, after applying a second write transactions to a storage system, in accordance with an embodiment of the present invention.

FIGS. 4A and 4B are a simplified flowchart of a data protection method during a normal production mode, in accordance with an embodiment of the present invention.

FIGS. 5A and 5B are a simplified flowchart of a data protection method during a data recovery mode, prior to completion of rollback, in accordance with an embodiment of the present invention.

DETAILED DESCRIPTION

The following definitions are employed throughout the specification and claims.

BACKUP SITE—a facility where replicated production site data is stored; the backup site may be located in a remote site or at the same location as the production site;

DPA—a computer or a cluster of computers that serve as a data protection appliance, responsible for data protection services including inter alia data replication of a storage system, and journaling of I/O requests issued by a host computer to the storage system;

HOST—at least one computer or networks of computers that runs at least one data processing application that issues I/O requests to one or more storage systems; a host is an initiator with a SAN;

HOST DEVICE—an internal interface in a host, to a logical storage unit;

IMAGE—a copy of a logical storage unit at a specific point in time;

INITIATOR—a node in a SAN that issues I/O requests;

JOURNAL—a record of write transactions issued to a storage system; used to maintain a duplicate storage system, and to rollback the duplicate storage system to a previous point in time;

LOGICAL UNIT—a logical entity provided by a storage system for accessing data from the storage system;

LUN—a logical unit number for identifying a logical unit;

PHYSICAL STORAGE UNIT—a physical entity, such as a disk or an array of disks, for storing data in storage locations that can be accessed by address;

PRODUCTION SITE—a facility where one or more host computers run data processing applications that write data to a storage system and read data from the storage system;

SAN—a storage area network of nodes that send and receive I/O and other requests, each node in the network being an initiator or a target, or both an initiator and a target;

SOURCE SIDE—a transmitter of data within a data replication workflow, during normal operation a production site is the source side; and during data recovery a backup site is the source side;

STORAGE SYSTEM—a SAN entity that provides multiple logical units for access by multiple SAN initiators;

TARGET—a node in a SAN that replies to I/O requests;

TARGET SIDE—a receiver of data within a data replication workflow; during normal operation a back site is the target side, and during data recovery a production site is the target side;

WAN—a wide area network that connects local networks and enables them to communicate with one another, such as the Internet.

Figure 1:
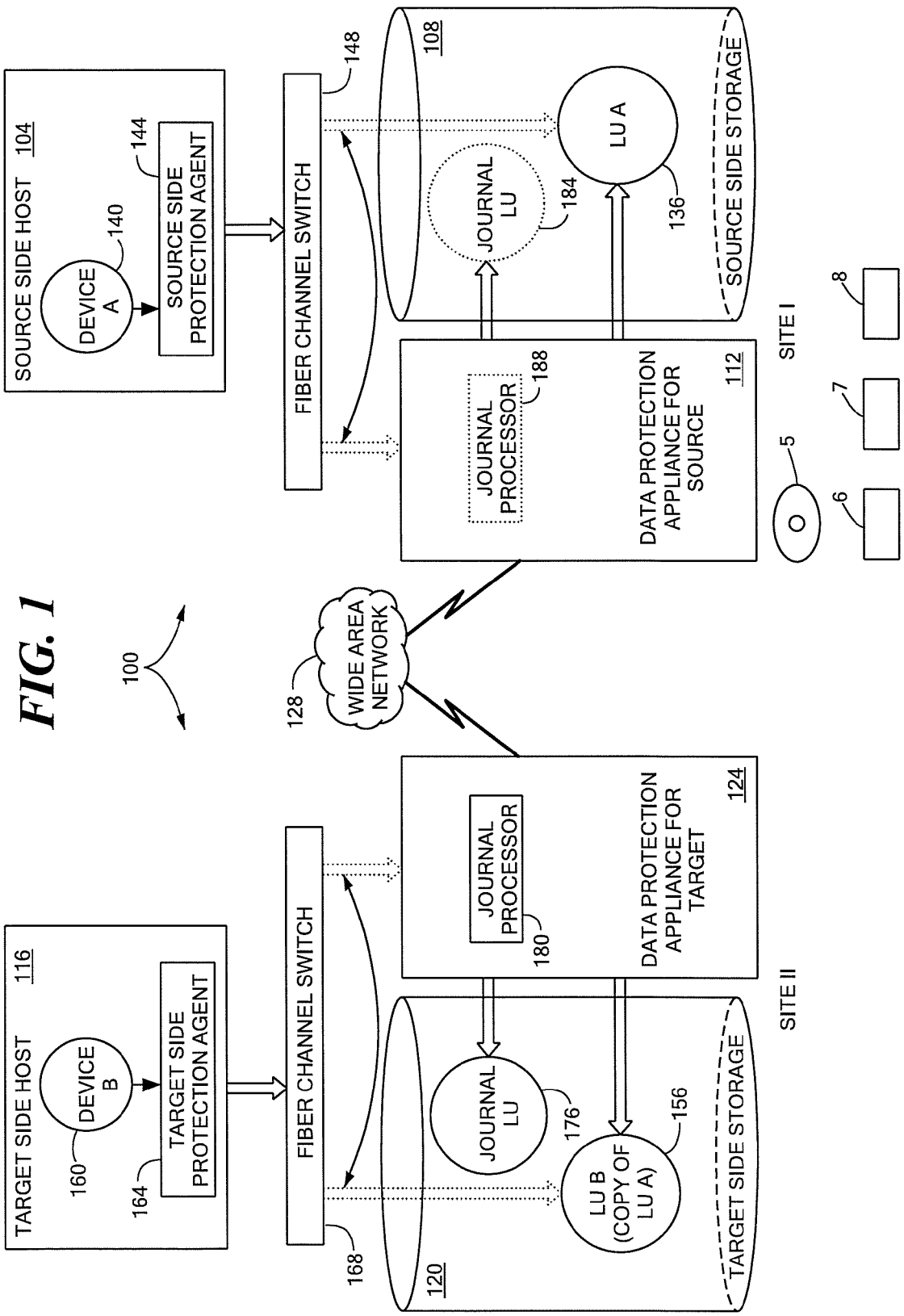
FIG. 1 is a simplified block diagram of a data protection system, in accordance with an embodiment of the present invention.

Reference is now made to FIG. 1, which is a simplified illustration of a data protection system 100, in accordance with an embodiment of the present invention. Shown in FIG. 1 are two sites; Site I, which is a production site, on the right, and Site II, which is a backup site, on the left. Under normal operation the production site is the source side of system 100, and the backup site is the target side of the system. The backup site is responsible for replicating production site data. Additionally, the backup site enables rollback of Site I data to an earlier pointing time, which may be used in the event of data corruption of a disaster, or alternatively in order to view or to access data from an earlier point in time.

During normal operations, the direction of replicate data flow goes from source side to target side. It is possible, however, for a user to reverse the direction of replicate data flow, in which case Site I starts to behave as a target backup site, and Site II starts to behave as a source production site. Such change of replication direction is referred to as a "failover". A failover may be performed in the event of a disaster at the production site, or for other reasons. In some data architectures, Site I or Site II behaves as a production site for a portion of stored data, and behaves simultaneously as a backup site for another portion of stored data. In some data architectures, a portion of stored data is replicated to a backup site, and another portion is not.

The production site and the backup site may be remote from one another, or they may both be situated at a common site, local to one another. Local data protection has the advantage of minimizing data lag between target and source, and remote data protection has the advantage is being robust in the event that a disaster occurs at the source side.

The source and target sides communicate via a wide area network (WAN) 128, although other types of networks are also adaptable for use with the present invention.

In accordance with an embodiment of the present invention, each side of system 100 includes three major components coupled via a storage area network (SAN); namely, (i) a storage system, (ii) a host computer, and (iii) a data protection appliance (DPA). Specifically with reference to FIG. 1, the source side SAN includes a source host computer 104, a source storage system 108, and a source DPA 112. Similarly, the target side SAN includes a target host computer 116, a target storage system 120, and a target DPA 124.

Generally, a SAN includes one or more devices, referred to as "nodes". A node in a SAN may be an "initiator" or a "target", or both. An initiator node is a device that is able to initiate requests to one or more other devices; and a target node is a device that is able to reply to requests, such as SCSI commands, sent by an initiator node. A SAN may also include network switches, such as fiber channel switches. The communication links between each host computer and its corresponding storage system may be any appropriate medium suitable for data transfer, such as fiber communication channel links.

In an embodiment of the present invention, the host communicates with its corresponding storage system using small computer system interface (SCSI) commands.

System 100 includes source storage system 108 and target storage system 120. Each storage system includes physical storage units for storing data, such as disks or arrays of disks. Typically, storage systems 108 and 120 are target nodes. In order to enable initiators to send requests to storage system 108, storage system 108 exposes one or more logical units (LU) to which commands are issued. Thus, storage systems 108 and 120 are SAN entities that provide multiple logical units for access by multiple SAN initiators.

Logical units are a logical entity provided by a storage system, for accessing data stored in the storage system. A logical unit is identified by a unique logical unit number (LUN). In an embodiment of the present invention, storage system 108 exposes a logical unit 136, designated as LU A, and storage system 120 exposes a logical unit 156, designated as LU B.

In an embodiment of the present invention, LU B is used for replicating LU A. As such, LU B is generated as a copy of LU A. In one embodiment, LU B is configured so that its size is identical to the size of LU A. Thus for LU A, storage system 120 serves as a backup for source side storage system 108. Alternatively, as mentioned hereinabove, some logical units of storage system 120 may be used to back up logical units of storage system 108, and other logical units of storage system 120 may be used for other purposes. Moreover, in certain embodiments of the present invention, there is symmetric replication whereby some logical units of storage system 108 are used for replicating logical units of storage system 120, and other logical units of storage system 120 are used for replicating other logical units of storage system 108.

System 100 includes a source side host computer 104 and a target side host computer 116. A host computer may be one computer, or a plurality of computers, or a network of distributed computers, each computer may include inter alia a conventional CPU, volatile and non-volatile memory, a data bus, an I/O interface, a display interface and a network interface. Generally a host computer runs at least one data processing application, such as a database application and an e-mail server.

Generally, an operating system of a host computer creates a host device for each logical unit exposed by a storage system in the host computer SAN. A host device is a logical entity in a host computer, through which a host computer may access a logical unit. In an embodiment of the present invention, host device 104 identifies LU A and generates a corresponding host device 140, designated as Device A, through which it can access LU A. Similarly, host computer 116 identifies LU B and generates a corresponding device 160, designated as Device B.

In an embodiment of the present invention, in the course of continuous operation, host computer 104 is a SAN initiator that issues I/O requests (write/read operations) through host device 140 to LU A using, for example, SCSI commands. Such requests are generally transmitted to LU A with an address that includes a specific device identifier, an offset within the device, and a data size. Offsets are generally aligned to 512 byte blocks. The average size of a write operation issued by host computer 104 may be, for example, 10 kilobytes (KB); i.e., 20 blocks. For an I/O rate of 50 megabytes (MB) per second, this corresponds to approximately 5,000 write transactions per second.

System 100 includes two data protection appliances, a source side DPA 112 and a target side DPA 124. A DPA performs various data protection services, such as data replication of a storage system, and journaling of I/O requests issued by a host computer to source side storage system data. As explained in detail hereinbelow, when acting as a target side DPA, a DPA may also enable rollback of data to an earlier point in time, and processing of rolled back data at the target site. Each DPA 112 and 124 is a computer that includes inter alia one or more conventional CPUs and internal memory.

For additional safety precaution, each DPA is a cluster of such computers. Use of a cluster ensures that if a DPA computer is down, then the DPA functionality switches over to another computer. The DPA computers within a DPA cluster communicate with one another using at least one communication link suitable for data transfer via fiber channel or IP based protocols, or such other transfer protocol. One computer from the DPA cluster serves as the DPA leader. The DPA cluster leader coordinates between the computers in the cluster, and may also perform other tasks that require coordination between the computers, such as load balancing.

In the architecture illustrated in FIG. 1, DPA 112 and DPA 124 are standalone devices integrated within a SAN. Alternatively, each of DPA 112 and DPA 124 may be integrated into storage system 108 and storage system 120, respectively, or integrated into host computer 104 and host computer 116, respectively. Both DPAs communicate with their respective host computers through communication lines such as fiber channels using, for example, SCSI commands.

In accordance with an embodiment of the present invention, DPAs 112 and 124 are configured to act as initiators in the SAN; i.e., they can issue I/O requests using, for example, SCSI commands, to access logical units on their respective storage systems. DPA 112 and DPA 124 are also configured with the necessary functionality to act as targets; i.e., to reply to I/O requests, such as SCSI commands, issued by other initiators in the SAN, including inter alia their respective host computers 104 and 116. Being target nodes, DPA 112 and DPA 124 may dynamically expose or remove one or more logical units.

As described hereinabove, Site I and Site II may each behave simultaneously as a production site and a backup site for different logical units. As such, DPA 112 and DPA 124 may each behave as a source DPA for some logical units, and as a target DPA for other logical units, at the same time.

In accordance with an embodiment of the present invention, host computer 104 and host computer 116 include protection agents 144 and 164, respectively. Protection agents 144 and 164 intercept SCSI commands issued by their respective host computers, via host devices to logical units that are accessible to the host computers. In accordance with an embodiment of the present invention, a data protection agent may act on an intercepted SCSI commands issued to a logical unit, in one of the following ways:

Send the SCSI commands to its intended logical unit.

Redirect the SCSI command to another logical unit.

Split the SCSI command by sending it first to the respective DPA. After the DPA returns an acknowledgement, send the SCSI command to its intended logical unit.

Fail a SCSI command by returning an error return code.

Delay a SCSI command by not returning an acknowledgement to the respective host computer.

A protection agent may handle different SCSI commands, differently, according to the type of the command. For example, a SCSI command inquiring about the size of a certain logical unit may be sent directly to that logical unit, while a SCSI write command may be split and sent first to a DPA associated with the agent. A protection agent may also change its behavior for handling SCSI commands, for example as a result of an instruction received from the DPA.

Specifically, the behavior of a protection agent for a certain host device generally corresponds to the behavior of its associated DPA with respect to the logical unit of the host device. When a DPA behaves as a source site DPA for a certain logical unit, then during normal course of operation, the associated protection agent splits I/O requests issued by a host computer to the host device corresponding to that logical unit. Similarly, when a DPA behaves as a target device for a certain logical unit, then during normal course of operation, the associated protection agent fails I/O requests issued by host computer to the host device corresponding to that logical unit.

Communication between protection agents and their respective DPAs may use any protocol suitable for data transfer within a SAN, such as fiber channel, or SCSI over fiber channel. The communication may be direct, or via a logical unit exposed by the DPA. In an embodiment of the present invention, protection agents communicate with their respective DPAs by sending SCSI commands over fiber channel.

In an embodiment of the present invention, protection agents 144 and 164 are drivers located in their respective host computers 104 and 116. Alternatively, a protection agent may also be located in a fiber channel switch, or in any other device situated in a data path between a host computer and a storage system.

What follows is a detailed description of system behavior under normal production mode, and under recovery mode.

In accordance with an embodiment of the present invention, in production mode DPA 112 acts as a source site DPA for LU A. Thus, protection agent 144 is configured to act as a source side protection agent; i.e., as a splitter for host device A. Specifically, protection agent 144 replicates SCSI I/O requests. A replicated SCSI I/O request is sent to DPA 112. After receiving an acknowledgement from DPA 124, protection agent 144 then sends the SCSI I/O request to LU A. Only after receiving a second acknowledgement from storage system 108 will host computer 104 initiate another I/O request.

When DPA 112 receives a replicated SCSI write request from data protection agent 144, DPA 112 transmits certain I/O information characterizing the write request, packaged as a "write transaction", over WAN 128 to DPA 124 on the target side, for journaling and for incorporation within target storage system 120.

DPA 112 may send its write transactions to DPA 124 using a variety of modes of transmission, including inter alia (i) a synchronous mode, (ii) an asynchronous mode, and (iii) a snapshot mode. In synchronous mode, DPA 112 sends each write transaction to DPA 124, receives back an acknowledgement from DPA 124, and in turns sends an acknowledgement back to protection agent 144. Protection agent 144 waits until receipt of such acknowledgement before sending the SCSI write request to LU A.

In asynchronous mode, DPA 112 sends an acknowledgement to protection agent 144 upon receipt of each I/O request, before receiving an acknowledgement back from DPA 124.

In snapshot mode, DPA 112 receives several I/O requests and combines them into an aggregate "snapshot" of all write activity performed in the multiple I/O requests, and sends the snapshot to DPA 124, for journaling and for incorporation in target storage system 120. In snapshot mode DPA 112 also sends an acknowledgement to protection agent 144 upon receipt of each I/O request, before receiving an acknowledgement back from DPA 124.

For the sake of clarity, the ensuing discussion assumes that information is transmitted at write-by-write granularity.

While in production mode, DPA 124 receives replicated data of LU A from DPA 112, and performs journaling and writing to storage system 120. When applying write operations to storage system 120, DPA 124 acts as an initiator, and sends SCSI commands to LU B.

During a recovery mode, DPA 124 undoes the write transactions in the journal, so as to restore storage system 120 to the state it was at, at an earlier time.

As described hereinabove, in accordance with an embodiment of the present invention, LU B is used as a backup of LU A. As such, during normal production mode, while data written to LU A by host computer 104 is replicated from LU A to LU B, host computer 116 should not be sending I/O requests to LU B. To prevent such I/O requests from being sent, protection agent 164 acts as a target site protection agent for host Device B and fails I/O requests sent from host computer 116 to LU B through host Device B.

In accordance with an embodiment of the present invention, target storage system 120 exposes a logical unit 176, referred to as a "journal LU", for maintaining a history of write transactions made to LU B, referred to as a "journal". Alternatively, journal LU 176 may be striped over several logical units, or may reside within all of or a portion of another logical unit. DPA 124 includes a journal processor 180 for managing the journal.

Journal processor 180 functions generally to manage the journal entries of LU B. Specifically, journal processor 180 (i) enters write transactions received by DPA 124 from DPA 112 into the journal, by writing them into the journal LU, (ii) applies the journal transactions to LU B, and (iii) updates the journal entries in the journal LU with undo information and removes already-applied transactions from the journal. As described below, with reference to FIGS. 2 and 3A-3D, journal entries include four streams, two of which are written when write transaction are entered into the journal, and two of which are written when write transaction are applied and removed from the journal.

Figure 2:
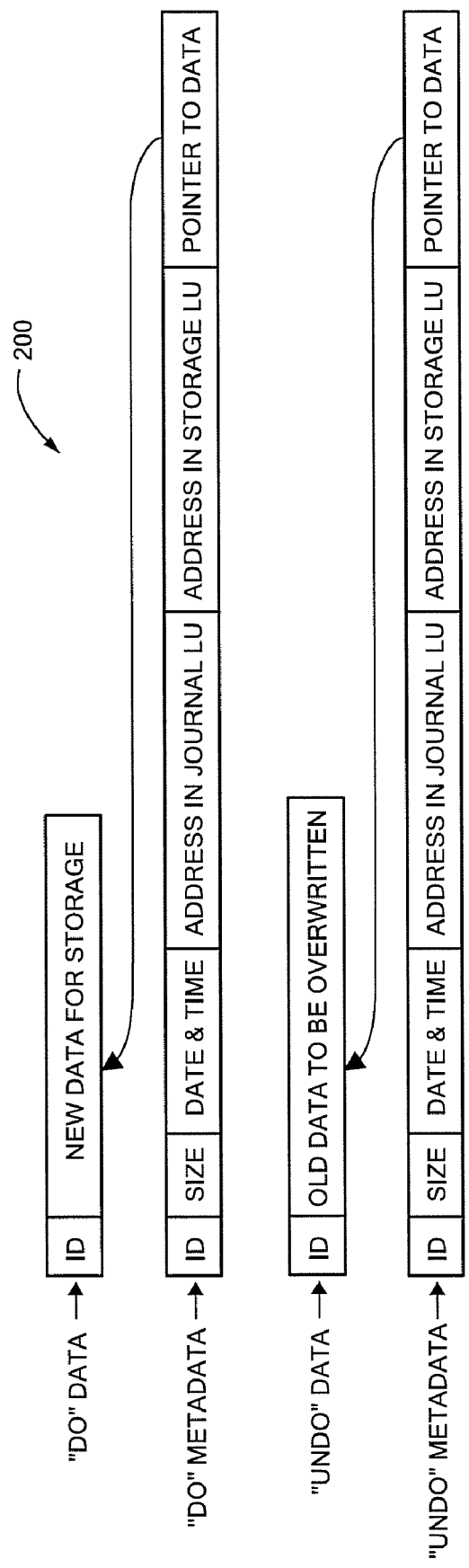
FIG. 2 is a simplified illustration of a journal history of write transactions for a storage system, in accordance with an embodiment of the present invention.

Reference is now made to FIG. 2, which is a simplified illustration of a write transaction 200 for a journal, in accordance with an embodiment of the present invention. The journal may be used to provide an adaptor for access to storage 120 at the state it was in at any specified point in time. Since the journal contains the "undo" information necessary to rollback storage system 120, data that was stored in specific memory locations at the specified point in time may be obtained by undoing write transactions that occurred subsequent to such point in time.

Write transaction 200 generally includes the following fields:

one or more identifiers;

a time stamp, which is the date & time at which the transaction was received by source side DPA 112;

a write size, which is the size of the data block; a location in journal LU 176 where the data is entered;

a location in LU B where the data is to be written; and the data itself.

Write transaction 200 is transmitted from source side DPA 112 to target side DPA 124. As shown in FIG. 2, DPA 124 records the write transaction 200 in four streams. A first stream, referred to as a DO stream, includes new data for writing in LU B. A second stream, referred to as an DO METADATA stream, includes metadata for the write transaction, such as an identifier, a date & time, a write size, a beginning address in LU B for writing the new data in, and a pointer to the offset in the do stream where the corresponding data is located. Similarly, a third stream, referred to as an UNDO stream, includes old data that was overwritten in LU B; and a fourth stream, referred to as an UNDO METADATA, include an identifier, a date & time, a write size, a beginning address in LU B where data was to be overwritten, and a pointer to the offset in the undo stream where the corresponding old data is located.

In practice each of the four streams holds a plurality of write transaction data. As write transactions are received dynamically by target DPA 124, they are recorded at the end of the DO stream and the end of the DO METADATA stream, prior to committing the transaction. During transaction application, when the various write transactions are applied to LU B, prior to writing the new DO data into addresses within the storage system, the older data currently located in such addresses is recorded into the UNDO stream.

By recording old data, a journal entry can be used to "undo" a write transaction. To undo a transaction, old data is read from the UNDO stream in a reverse order, from the most recent data to the oldest data, for writing into addresses within LU B. Prior to writing the UNDO data into these addresses, the newer data residing in such addresses is recorded in the DO stream.

The journal LU is partitioned into segments with a predefined size, such as 1 MB segments, with each segment identified by a counter. The collection of such segments forms a segment pool for the four journaling streams described hereinabove. Each such stream is structured as an ordered list of segments, into which the stream data is written, and includes two pointers—a beginning pointer that points to the first segment in the list and an end pointer that points to the last segment in the list.

According to a write direction for each stream, write transaction data is appended to the stream either at the end, for a forward direction, or at the beginning, for a backward direction. As each write transaction is received by DPA 124, its size is checked to determine if it can fit within available segments. If not, then one or more segments are chosen from the segment pool and appended to the stream's ordered list of segments.

Thereafter the DO data is written into the DO stream, and the pointer to the appropriate first or last segment is updated. Freeing of segments in the ordered list is performed by simply changing the beginning or the end pointer. Freed segments are returned to the segment pool for re-use.

When a write transaction is received, journaling is thus advanced as indicated in TABLE I below.

TABLE I

Entering a write transaction in the journal

| | |
|---|---|
| Step 1 | The new data is written at the end of the DO stream, assuming a forward write direction, and corresponding metadata is written at the end of the DO METADATA stream. |
| Step 2 | Data is read from the beginning of the DO stream, and corresponding metadata is read from the beginning of the DO METADATA stream. |
| Step 3 | Old data to be overwritten is read from LU B. The location and size of such old data is determined from the DO METADATA stream. |

TABLE I-continued

Entering a write transaction in the journal

| | |
|---|---|
| Step 4 | The old data is written at the end of the UNDO stream, and corresponding metadata is written at the end of the UNDO METADATA stream. |
| Step 5 | The new data read at Step 2 is written into LU B, and the beginning and end pointers of the DO and DO METADATA streams are moved appropriately. |

Conversely, during a rollback to undo a write transaction, the above operations are reversed, as indicated in TABLE II below.

TABLE II

Undoing a write transaction in the journal

| | |
|---|---|
| Step 1 | Read the data and metadata from the end of the UNDO and UNDO METADATA streams. |
| Step 2 | Read from LU B the data that is to be overwritten. The location and size of such data is determined from the UNDO METADATA stream. |
| Step 3 | Write the data from Step 2 at the beginning of the DO stream, and update the DO METADATA stream accordingly. |
| Step 4 | Write the data from Step 1 to LU B, and update the beginning and end pointers of the UNDO and UNDO metadata streams appropriately. |

The following example, in conjunction with FIGS. 3A-3D, describes specific details of the journaling process, in accordance with an embodiment of the present invention. A journal volume includes a plurality of segments from a segment pool, each segment including 20 data blocks.

Three write transactions are received, as indicated in TABLE III.

TABLE III

Example Write Transactions

| Write ID | Time | LU B location | Length | Journal LU location |
|---|---|---|---|---|
| 1 | Dec. 3, 2005 10:00:00.00 | LU B offset 57 blocks | 15 blocks | Segment 1, offset 0 |
| 2 | Dec. 3, 2005 10:00:00.05 | LU B offset 87 blocks | 20 blocks | Segment 1, offset 15 |
| 3 | Dec. 3, 2005 10:00:00.18 | LU B offset 12 blocks | 20 blocks | Segment 3, Offset 15 |

The following discussion describes four stages of journaling and data storage; namely, Stage #1: Enter the three write transactions as journal entries in the journal LU.

Stage #2: Apply the first write transaction to LU B.

Stage #3: Apply the second write transaction to LU B.

Stage #4: Rollback the second write transaction, to recover data from an earlier point in time.

The write transaction with ID=1 is written to the first 15 blocks of Segment #1. The metadata corresponding to this transaction is written to the first block of Segment #2. The second write transaction with ID=2 is written to the last 5 blocks of Segment #1 and the first 15 blocks of Segment #3. The metadata corresponding to this transaction is written to the second block of Segment #2. The third write transaction with ID=3 is written to the last 5 blocks of Segment #3 and the first 15 blocks of Segment #4. The metadata corresponding to this transaction is written to the third block of Segment #2.

Figure 3A:
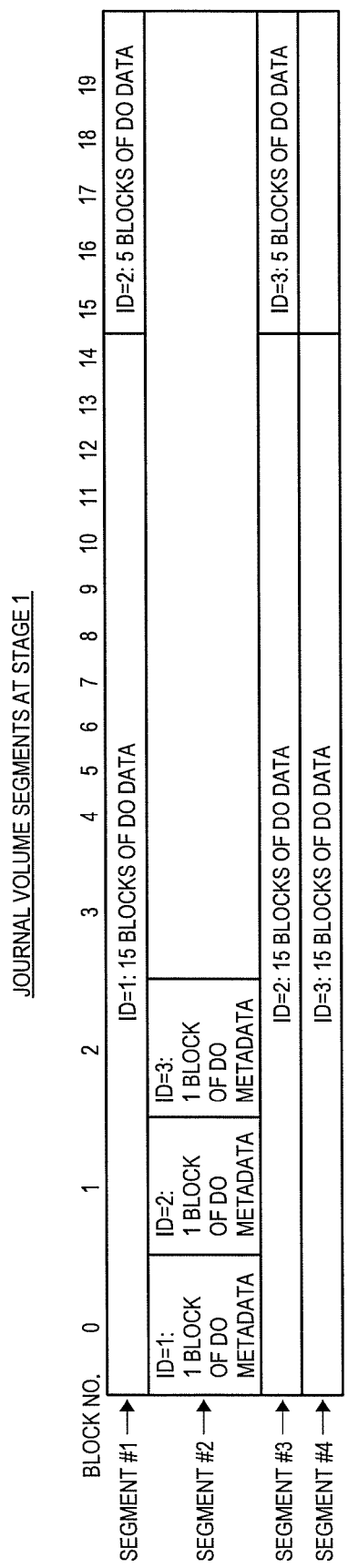
FIG. 3A is a simplified illustration of a first stage of a journal and four data streams stored therein, after recording three write transactions, in accordance with an embodiment of the present invention.

Thus at stage #1, the DO stream in memory includes a list of segments 1, 3, 4; and a beginning pointer to offset=0 in Segment #1 and an end pointer to offset=10 in Segment #4. The DO METADATA stream in memory includes a list of one segment, namely Segment #2; and a beginning pointer to offset=0 in Segment #2 and an end pointer to offset=3 in Segment #2. The UNDO stream and the UNDO METADATA stream are empty. The journal and the four streams at the end of stage #1 are illustrated in FIG. 3A.

At stage #2 the write transaction with ID=1 is applied to LU B. New data to be written is read from the journal LU at the offset and length indicated in the DO METADATA; namely, 15 blocks of data located in blocks 0-14 of journal volume Segment #1. Correspondingly, old data is read from LU B at the offset and length indicated in the UNDO METADATA; namely, 15 blocks of data located in blocks 57-71 of LU B. The old data is then written into the UNDO stream in the journal LU, and the associated metadata is written into the UNDO METADATA stream in the journal LU. Specifically, for this example, the UNDO data is written into the first 15 blocks of Segment #5, and the UNDO METADATA is written into the first block of Segment #6. The beginning pointer of the UNDO data stream is set to offset=0 in Segment #5, and the end pointer is set to offset=15 in Segment #5. Similarly, the beginning pointer of the UNDO METADATA stream is set to offset=0 on Segment #6, and the end pointer is set to offset=1 in Segment #6.

Figure 3B:
FIG. 3B is a simplified illustration of a second stage of a journal and four data streams stored therein, after applying a first write transactions to a storage system, in accordance with an embodiment of the present invention.

At this point, the new data that was read from blocks 0-14 of journal LU Segment #1 is written to blocks 57-71 of LU B. The beginning pointer for the DO stream is moved forward to block 15 of journal LU Segment #1, and the beginning pointer for the DO METADATA stream is moved forward to block 1 of journal LU Segment #2. The journal and the four streams at the end of stage #2 are illustrated in FIG. 3B.

At stage #3 the write transaction with ID=2 is applied to the storage system. As above, 20 blocks of new data are read from blocks 15-19 of journal LU Segment #1 and from blocks 0-14 of journal LU Segment #3. Similarly, 20 blocks of old data are read from blocks 87-106 of LU B. The old data is written to the UNDO stream in the last 5 blocks of journal LU Segment #5 and the first 15 blocks of journal LU Segment #7. The associated metadata is written to the UNDO METADATA stream in the second block of Segment #6. The list of segments in the UNDO stream includes Segment #5 and Segment #7. The end pointer of the UNDO stream is moved to block 15 of Segment #7, and the end pointed of the UNDO METADATA stream is moved to block 2 of Segment #6.

Finally, the new data from blocks 15-19 of journal LU Segment #1 and blocks 0-14 of journal LU Segment #3 is written into blocks 87-106 of LU B. The beginning pointer for the DO stream is moved forward to block 15 of journal volume Segment #3, and the beginning pointer for the DO METADATA stream is moved forward to block 2 of journal LU Segment #2. Segment #1 is freed from the DO stream, for recycling within the segment pool, and the list of segments for the DO stream is changed to Segment #3 and Segment #4. The journal and the four streams at the end of stage #3 are illustrated in FIG. 3C.

At stage #4 a rollback to time 10:00:00.00 is performed. Since the write transaction with ID=3 was not applied yet, the only write transaction to be undone is the write transaction with ID=2. The last entry is read from the UNDO METADATA stream, the location of the end of the UNDO METADATA stream being determined by its end pointer, i.e., the metadata before block 2 of journal LU Segment #6 is read, indicating two areas each of 20 blocks; namely, (a) the last 5 blocks of journal LU Segment #5 and the first 15 blocks of journal LU Segment #7, and (b) blocks 87-106 of LU B. Area (a) is part of the UNDO stream.

The 20 blocks of data from area (b) are read from LU B and written to the beginning of the DO stream. As the beginning pointer of the DO stream is set to offset=15 of journal LU Segment #3, 5 blocks are written at the end of Segment #3, and the remaining 15 blocks are written to Segment #8. The end pointer for the DO stream is set to block 15 of Segment #8. The list of segments for the DO stream is changed to Segment #3, Segment #4 and Segment #8. The metadata associated with the 20 blocks from area (b) is written to block 3 of Segment #2, and the end pointer of the DO METADATA stream is advanced to block 4 of Segment #2.

Figure 3D:
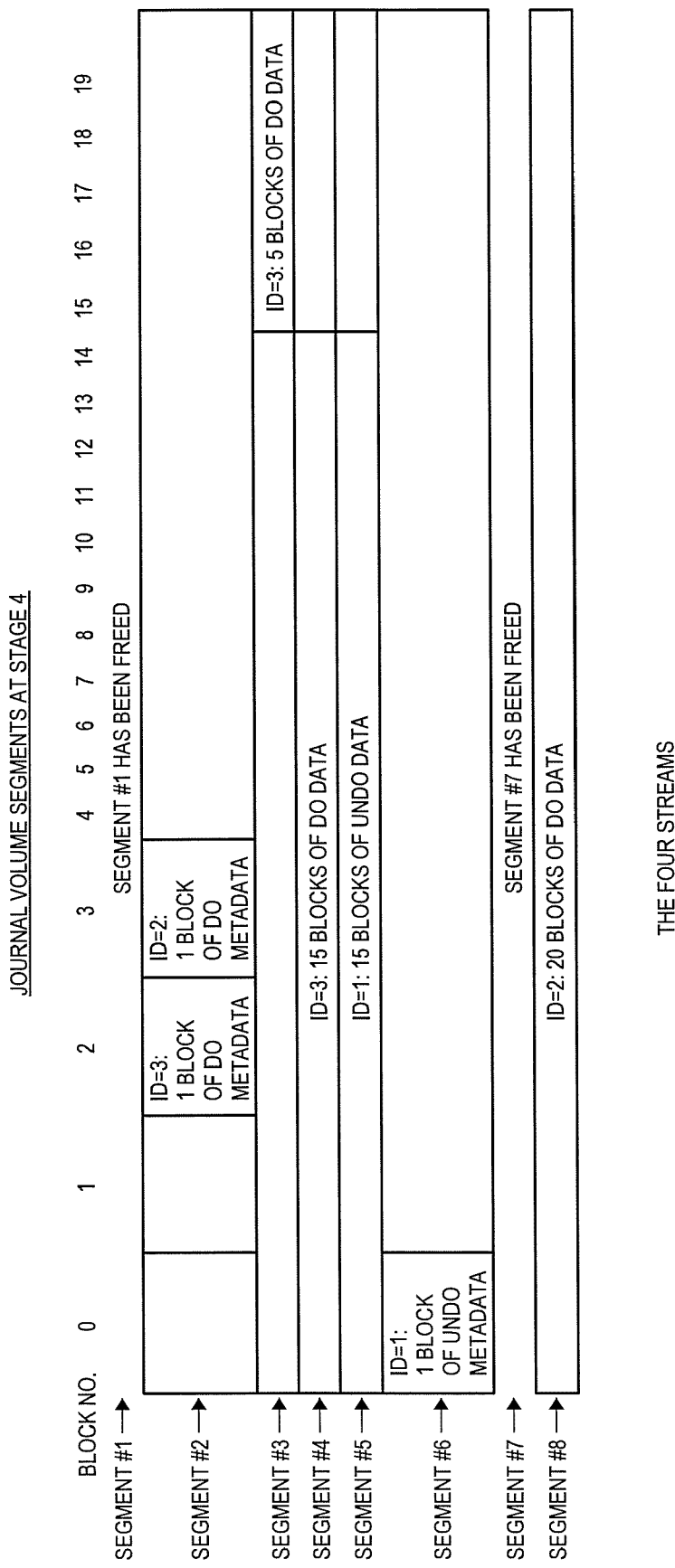
FIG. 3D is a simplified illustration of a fourth stage of a journal history and four data streams stored therein, after rolling back a write transaction, in accordance with an embodiment of the present invention.

The 20 blocks of data in area (a) of the journal LU are then written to area (b) of the LU B. Finally, Segment #7 is freed for recycling in the segment pool, the UNDO stream ending pointer is moved back to Segment #5 of the journal LU, block 15, and the UNDO METADATA stream ending pointed is moved back to Segment #6 of the journal LU, block 1. The journal and the four streams at the end of stage #4 are illustrated in FIG. 3D.

Thus it may be appreciated that the journal is thus used to rollback LU B to the state that it was in at a previous point in time. The journal is also used to selectively access data from LU B at such previous point in time, without necessarily performing a rollback. Selective access is useful for correcting one or more files that are currently corrupt, or for simply accessing old data.

TABLE IV below summarizes the behavior of the special protection components of system 100 during production mode. Reference is also made to FIGS. 4A and 4B, which is a simplified flowchart of a data protection method corresponding to TABLE IV. FIGS. 4A and 4B are divided into four columns. The leftmost column indicates steps performed by source side protection agent 112, the middle left column indicates steps performed by source side DPA 144, the middle right column indicates steps performed by target side DPA 124, and the rightmost column indicates steps performed by target side protection agent 164.

TABLE IV

Normal Production Mode Functionality

| System Component | Behavior |
|---|---|
| Source Side Agent 144 | Intercept SCSI commands issued to LU A by source side host via Device A (step 404). Replicate write commands, and route write commands to DPA (steps 408 and 412). Wait for first acknowledgement, from DPA (step 416), and then route replicate I/O command to LU A (step 420). Wait for second acknowledgement, from storage system (step 424), and then process next intercepted SCSI command (step 404). |
| Source Side DPA 112 | Receive write command from agent (step 428). Format write command as write transaction, and send to target DPA (step 428). In synchronous mode, wait for acknowledgement from target DPA (step 432), and then send acknowledgement to agent (step 436). In asynchronous mode and in snapshot mode, send acknowledgement to agent without waiting for acknowledgement from target DPA (step 436). |
| Target Side DPA 124 | Receive write transaction from source DPA (step 444). Enter write transaction in journal DO and DO METADATA streams (step 444), and send back acknowledgement to source DPA (step 448). Process journal entries by applying them to LU B, and enter undo information in UNDO and UNDO METADATA streams (step 440). |

TABLE IV-continued

Normal Production Mode Functionality

| System Component | Behavior |
| --- | --- |
| Target Side Agent 164 | Fail SCSI commands issued to LU B (step 452). |

Only steps with arrows connecting them in FIGS. 4A and 4B are necessarily sequential. Thus steps 432 and 436, which do not have arrows connecting them, are not necessarily sequential. In synchronous mode these steps are sequential, but in asynchronous mode and in snapshot mode they are not sequential. In particular, DPA 112 may send an acknowledgement to protection agent 144 before receiving an acknowledgement back from DPA 124.

It is also noted in FIGS. 4A and 4B that the steps performed by target side DPA 124 include two non-sequential groups; namely, (i) step 440, and (ii) steps 444 and 448.

Recovery mode is generally triggered as a result of a disaster at the source side. The source side data may become corrupt, or may not exist at all. In such case, after recovery is completed at the backup site, a user may perform a failover operation by switching the roles of the production site and backup site. The original backup site becomes a current production site, and the original production site becomes a current backup site. Alternatively, recovery mode can be triggered without a failover, in order to access data from a previous point in time.

While in recovery mode, target site DPA 124 continues to receive new write transactions from DPA 112 and enter them at the ends of the DO and DO METADATA streams. However, unlike production mode behavior, DPA 124 stops applying journal entries received from DPA 112 to LU B. Instead, DPA 124 uses the UNDO stream of the journal to rollback LU B, as described hereinabove.

During recovery, after or possibly before rollback of LU B is complete, a user may wish to access data from the target site. To this end, protection agent 164 stops failing I/O requests issued by host computer 160 and begins redirecting them to DPA 124. The processing of data by host computer 160 during recovery mode is referred to as "target side processing (TSP)".

To manage TSP write commands that are received by target side DPA 124, journal processor 180 uses two additional data streams, referred to as TSP DO and TSP METADATA streams. When a TSP write command is received by DPA 124, it is entered at the end of the TSP DO stream and the end of the TSP DO METADATA stream. Since TSP writes relate to the state of LU B after the rollback is complete, the TSP DO stream writes are only applied to LU B after rollback is complete. Journal processor 180 applies TSP writes to LU B in a way similar to the way it applies write transactions deceiver from DPA 112; namely, journal processor 180 maintains the undo information for each write applied to LU B, in TSP UNDO and TSP UNDO METADATA streams.

When TSP read commands are received by target site DPA 124, DPA 124 returns the data to be read by identifying locations of the read command, and finding the most recent TSP write command or commands that were applied at these locations. The data is searched for (i) first in the TSP DO stream, and (ii) then in the journal UNDO data that was not yet applied to LU B and (iii) finally, if the data was not found in (i) and (ii), then the data is taken from LU B itself. In order to perform such a search efficiently, DPA 124 generates and stores in its memory a virtual image of the UNDO METADATA storage locations by using an efficient data structure, such as a binary search tree.

After rollback is completed, the TSP writes that were performed during the rollback are applied to LU B, and DPA 124 begins applying TSP writes synchronously; i.e., TSP writes are applied to LU B when they are received by DPA 124, without keeping them in the TSP DO stream. As such, when a read command is received after rollback is complete, it is sent directly to LU B instead of being redirected through DPA 124.

TABLES V and VI below summarize the behavior of the special protection components of system 100 during recovery mode, before and after the rollback is complete, in accordance with an embodiment of the present invention. Reference is also made to FIGS. 5A, 5B, 6A and 6B, which are simplified flowcharts of data protection methods corresponding to TABLES V and VI, respectively. FIGS. 5A, 5B, 6A and 6B are divided into four columns. The leftmost column indicates steps performed by target side protection agent 164, the middle left column indicates steps performed by target side DPA 124, the middle right column indicates steps performed by source side DPA 112, and the rightmost column indicates steps performed by source side protection agent 144.

TABLE V

Recovery Functionality prior to Completion of Rollback

| System Component | Behavior |
| --- | --- |
| Target Side Agent 164 | Intercept SCSI commands issued to LU B (step 576). Redirect commands to DPA (step 580). |
| Target Side DPA 124 | Use UNDO stream of journal to roll back target storage system (step 540). Continue receiving write transactions fiom DPA 112 and enter these transactions into DO and DO METADATA streams without applying them to LU B (step 548). Enter TSP write transactions to TSP DO and TSP DO METADATA streams (step 564). Create a virtual image, to reply to read commands issued during the recovery process (step 572). |
| Source Side DPA 112 | As in production mode. |
| Source Side Agent 144 | As in production mode. |

TABLE VI

Recovery Functionality after Completion of Rollback

| System Component | Behavior |
| --- | --- |
| Target Side Agent 164 | Intercept SCSI commands issued to LU B (step 664). Redirect write transactions to DPA (step 672), and route read commands directly to LU B (step 680). |
| Target Side DPA 124 | Apply TSP write transactions to LU B, in the same manner that write transactions received from DPA 112 are applied in production mode; i.e., by entering data into TSP UNDO and TSP UNDO METADATA streams (step 640). Enter DO information and write transactions received from DPA 112 into DO and DO METADATA streams, without applying them to LU B (step 644). Apply TSP write transactions to LU B as they are received (step 656). |
| Source Side DPA 112 | As in production mode. |
| Source Side Agent 144 | As in production mode. |

Figure 5A:
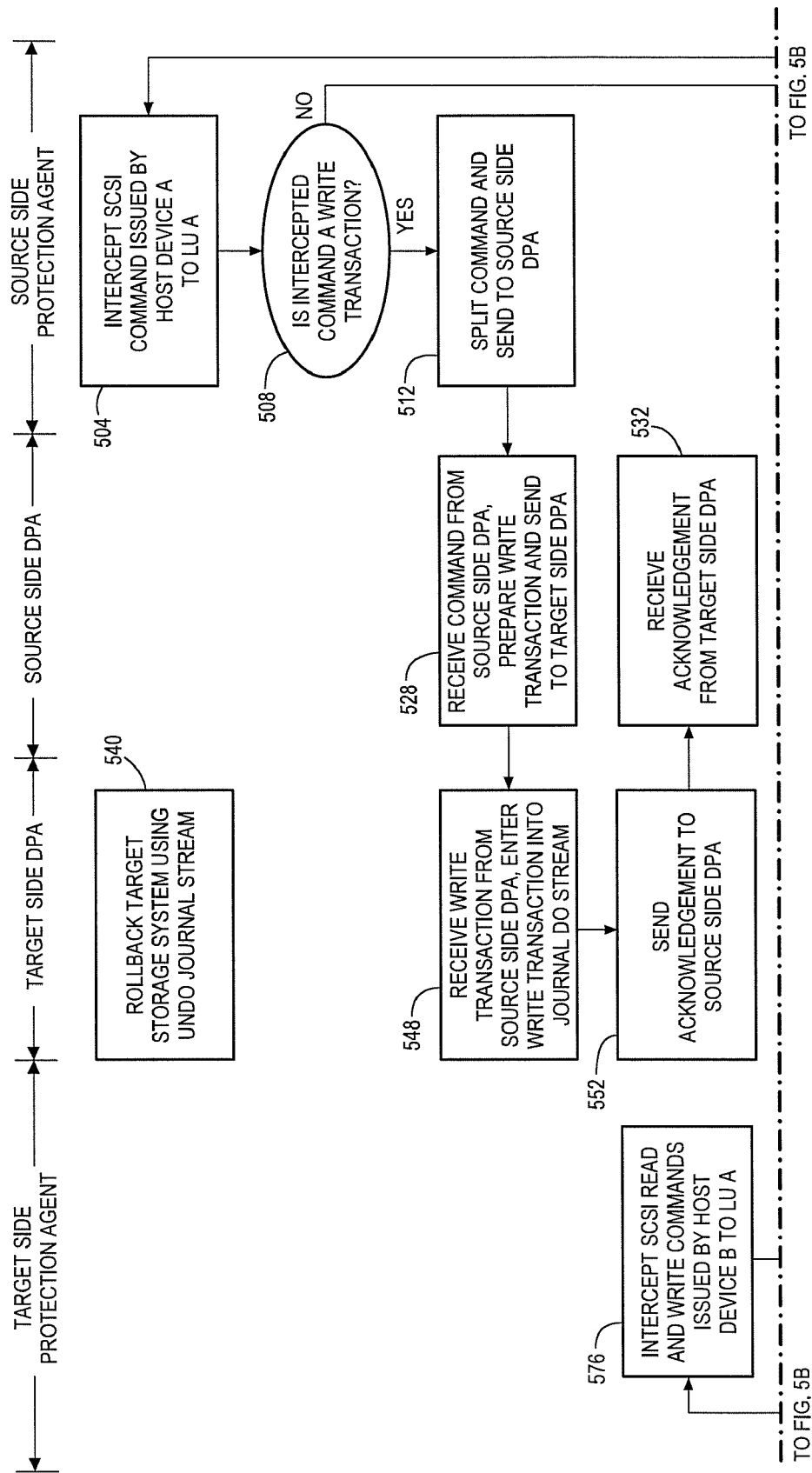
Figure 6A:
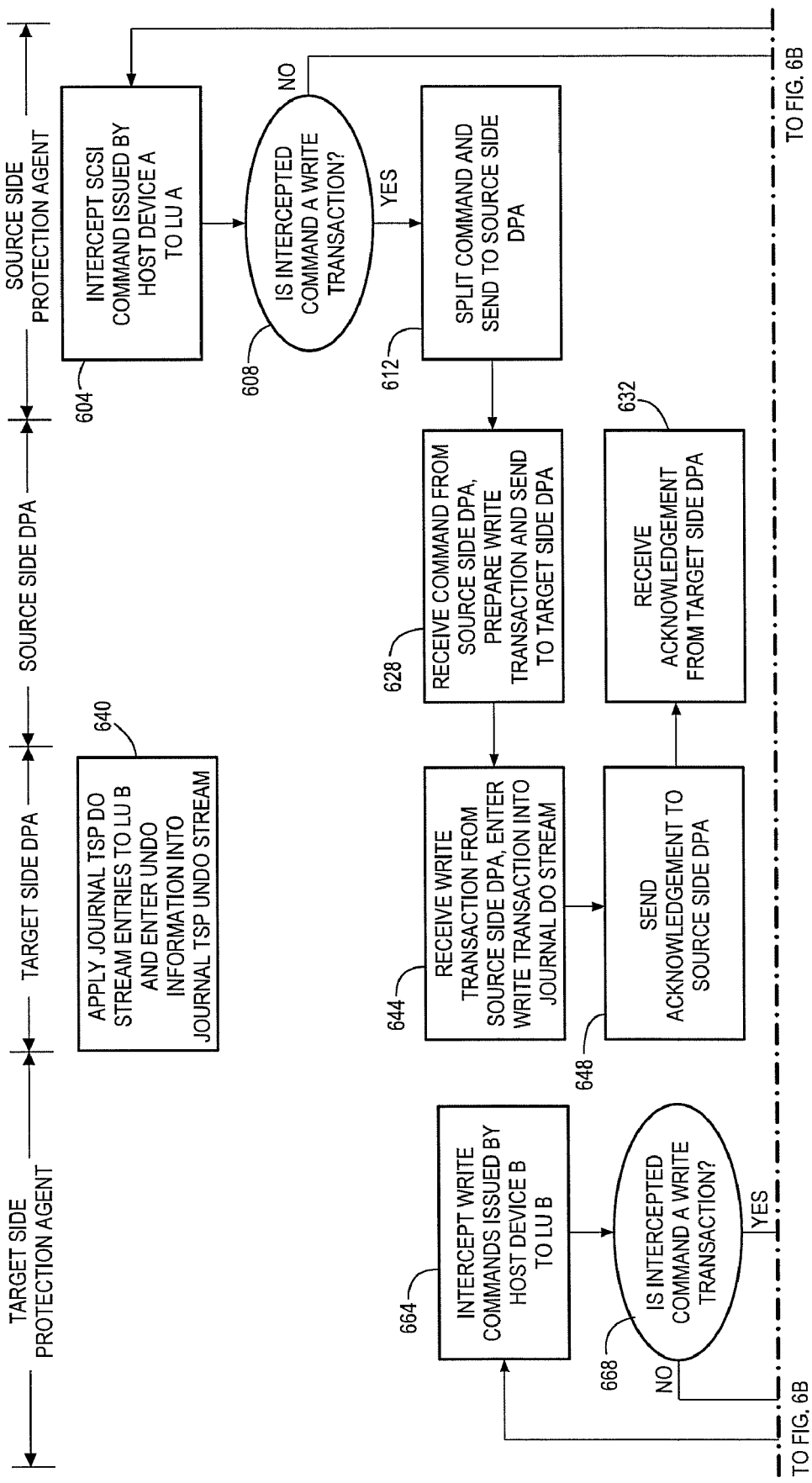
FIGS. 6A and 6B are is a simplified flowchart of a data protection method during a data recovery mode, after completion of rollback, in accordance with an embodiment of the present invention.
Figure 6B:
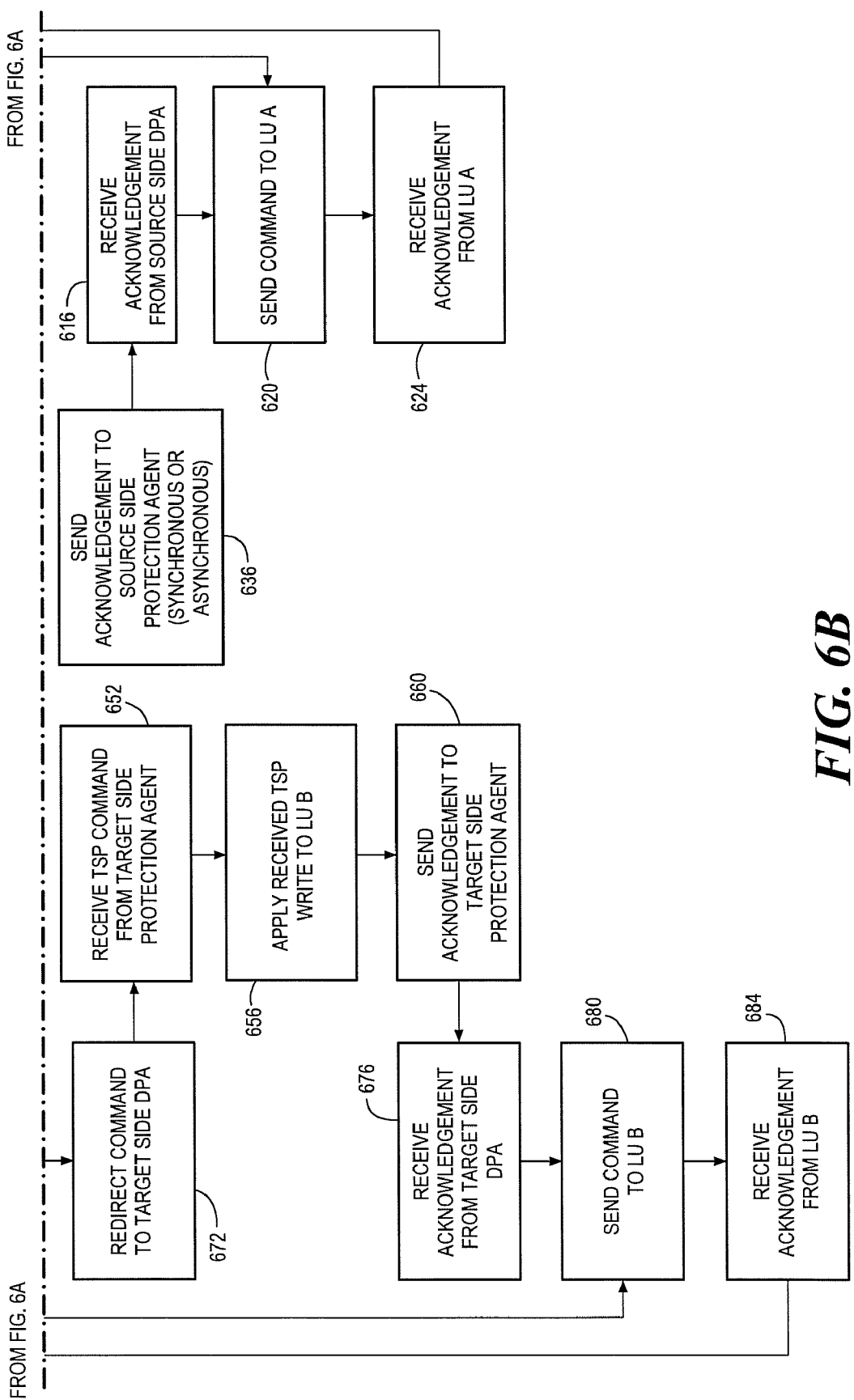

It is also noted in FIGS. 5A and 5B that the steps performed by target side DPA 124 include three non-sequential groups; namely, (i) step 540, (i) steps 548 and 552, and (iii) steps 556, 560, 564, 568 and 572. Similarly in FIGS. 6A and 6B target side DPA performs three non-sequential groups of steps; namely, (i) step 640, (ii) steps 644 and 648, and (iii) steps 652, 656 and 660.

Figure 7:
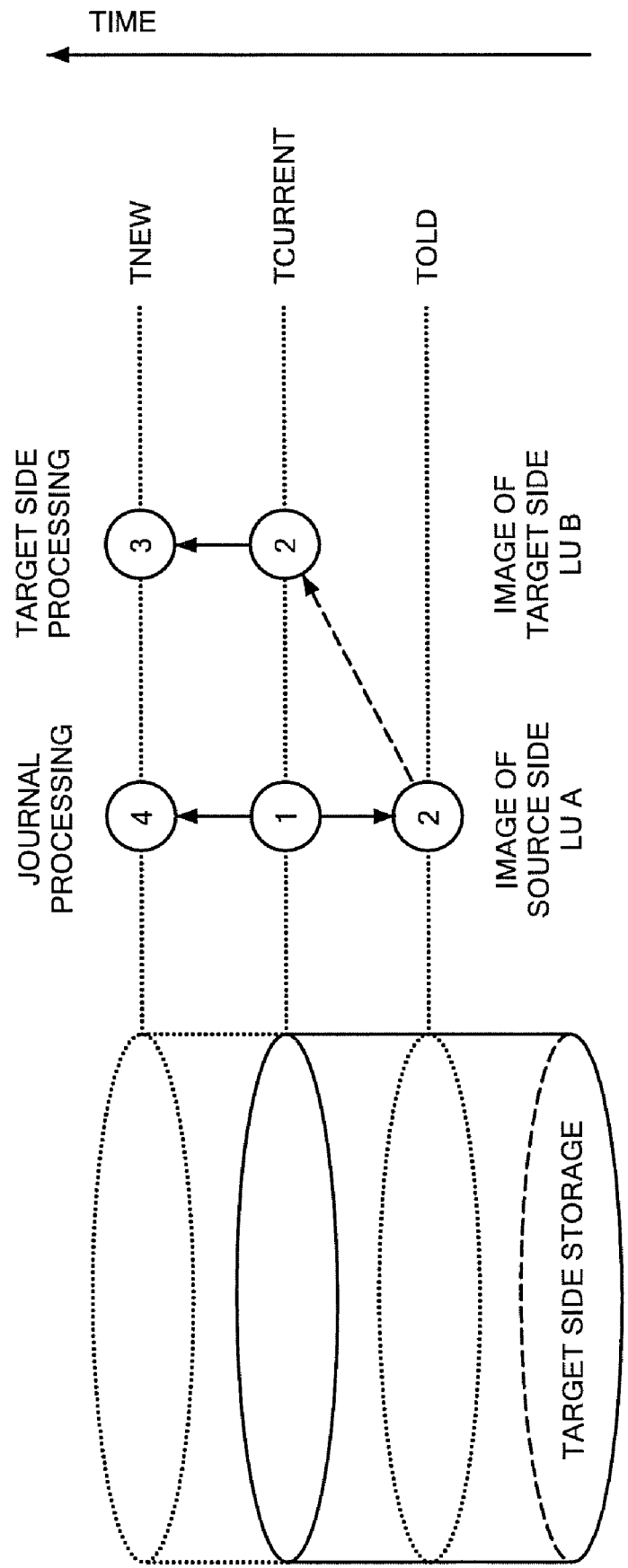
FIG. 7 is a simplified illustration of a time-line for tracking new processing of old data, in accordance with an embodiment of the present invention.

Reference is now made to FIG. 7, which is a simplified illustration of a time-line for tracking new processing of old data, in accordance with an embodiment of the present invention. FIG. 7 illustrates journal processor 180 bringing the timeline back to a previous time, TOLD, and journal processor 180 applying TSP writes to bring the timeline forward from time TCURRENT to time TNEW. As shown in FIG. 7, current data at time (1) is rolled back to old data at time (2). After rolling back the data to time (2), the rolled back data becomes the image upon which target side processing advances to new data at time (3); i.e., the target side processing is applied to data (2) and not to data (1).

The data at time (1) is a common image for LU A and LU B at the same point in time, TCURRENT. Similarly, the data at time (2) is a common image for LU A and LU B at time TOLD. Rolled back data at time (2) may be processed by TSP writes, while at the same time current data at time (1) is being processed by source side writes. As such, the data evolves along the path from time (2) to time (3) as it is processed by the target side, and along the path from time (2) to time (4) as it is processed by the source side. The data images at the source and target sides at time TNEW are thus different.

When the recovery process is completed, the user may (i) return to a normal production mode, or (ii) perform a failover by switching the replication direction. In case (i), LU B is rolled back to its state at time (2), and the write transactions along the path from (2) to (4) are applied to LU B, so as to bring LU B to the same image as LU A. Conversely, in case (ii), LU B is maintained at its state at time (3), and its data is copied from the target side to the source side so as to bring LU A to the same image as LU B.

It may be appreciated that after rolling back the UNDO data stream to LU B, the state of the target side storage is substantially identical to the state that LU A was in at an earlier point in time. However, after applying TSP writes, the state of LU B is then in a new state that is different from the earlier state of LU A. As such, in order to return to a normal production mode, and ensure that LU B is a copy of LU A, DPA 124 undoes the TSP writes that were written to LU B using the TSP undo stream, and then returns to its normal production mode and begins applying the data that was written into the DO stream. The DO stream includes all write transactions that were undone while LU B was rolled back. Additionally, the DO stream includes new journal entries that were received from DPA 112 while DPA was in recovery mode. Similarly, protection agent 164 returns to its production mode by beginning to fail I/O requests issued by host 116.

Alternatively, the user want to perform a failover; i.e., to make LU B in its current state a production LU and ensure that LU A is a copy of LU B. In this case the write transactions in the DO stream that correspond to a point in time subsequent to the recovered point in time are ignored. Additionally, the TSP writes that were applied to LU B during the recovery process are applied to LU A. Thereafter, the replication direction changes. Specifically, DPA 124 and protection agent 164 begin behaving in accordance with source site behavior, and DPA 112 and protection agent 144 begin behaving in accordance with target site behavior.

It may be appreciated that in order to provide failover capability, in which the roles of the production site and the backup site are switched, it is desirable that the source side has the necessary system components to function as a target side, and vice versa. Thus, in an embodiment of the present invention, the source side includes its own journal LU 184 and journal processor 188, as indicated with dotted lines in FIG. 1.

Figure 8:
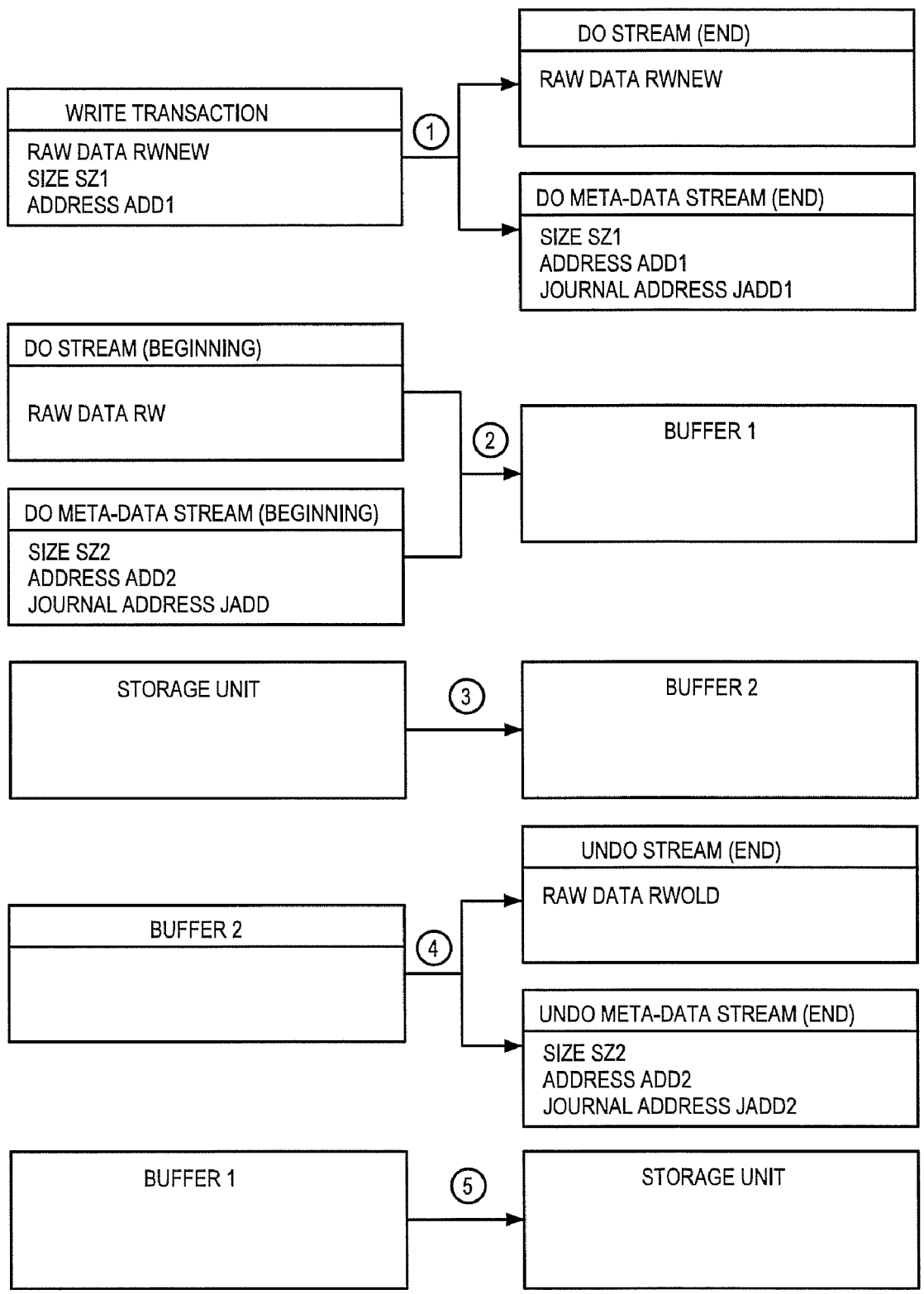
FIG. 8 is a simplified illustration of a five-stage journaling process for continuous data replication, in accordance with an embodiment of the present invention.

Referring back to TABLE I, it may be appreciated that during normal data replication, for each write transaction received from a production site, there are five I/O operations performed at a backup site. Reference is now made to FIG. 8, which is a simplified illustration of a 5-stage journaling process for continuous data replication, in accordance with an embodiment of the present invention. The five steps shown in FIG. 8 correspond respectively to the five steps listed in TABLE I. For the sake of clarity, FIG. 8 only shows three meta-data elements; namely, a size, a journal address and a storage address. It may be appreciated that the meta-data in the DO METADATA and UNDO METADATA streams includes an ID, a time, and other attributes.

In accordance with an embodiment of the present invention, the meta-data for each transaction is of a fixed size, typically 30 bytes. The raw data varies in size, typically averaging around 10 KB per transaction.

As write transactions performed at a production site vary in frequency, and as each write transaction at the production site normally requires five I/O transactions at the backup site, it may be appreciated that the size of the DO stream grows and shrinks accordingly. When the I/O rate is low, the beginning of the DO stream is close to the end of the DO stream. In such case, it is possible to keep all write transactions between the beginning and the end of the DO stream in memory, and there is no need to read the beginning of the DO stream for every new transaction received in the backup site. As such, step 2 may be skipped.

Figure 9:
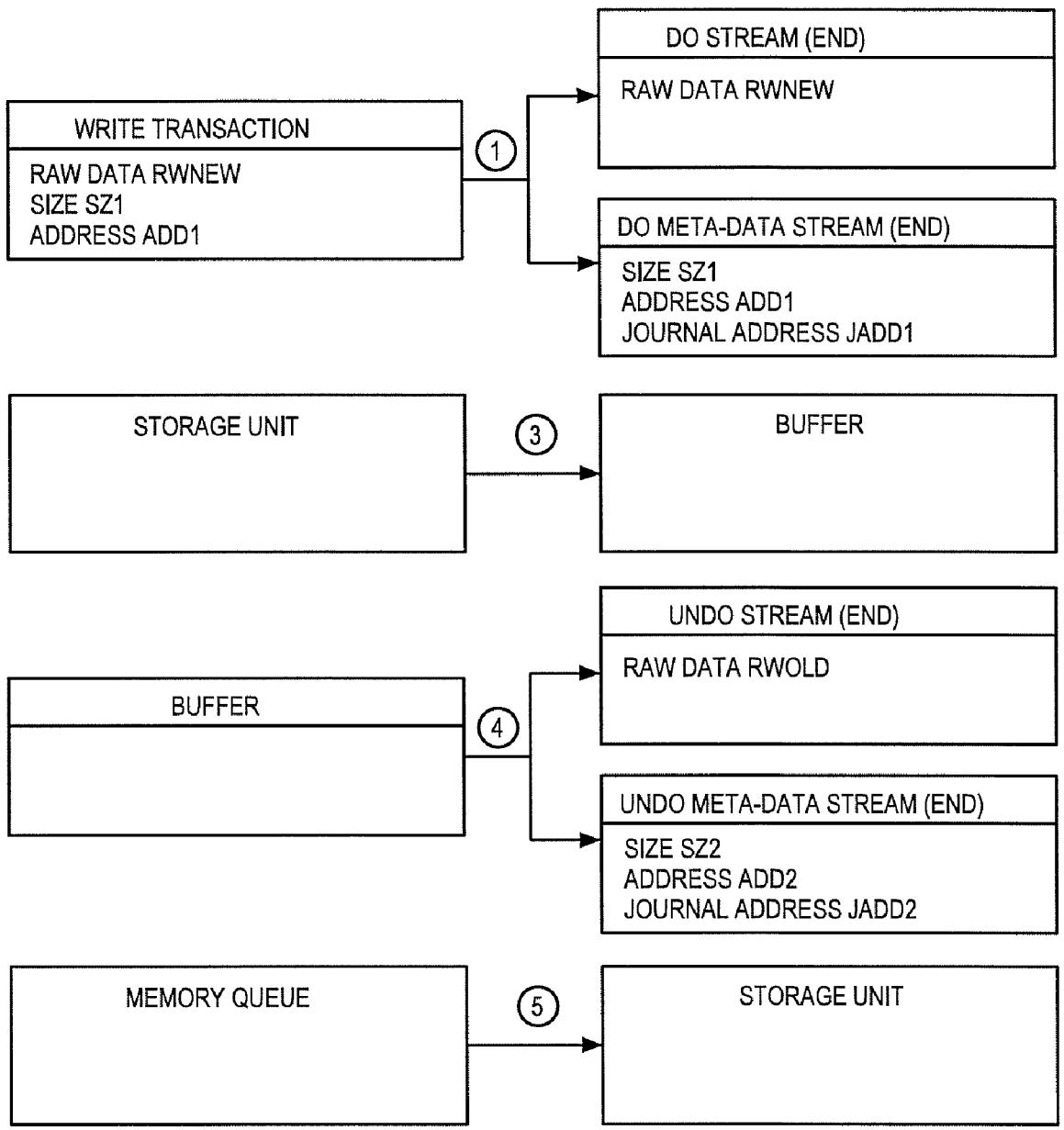
FIG. 9 is a simplified illustration of a four-stage journaling process for continuous data replication, for use when an I/O data rate is low, in accordance with an embodiment of the present invention.

Reference is now made to FIG. 9, which is a simplified illustration of a 4-stage journaling process for continuous data replication, for use when an I/O data rate is low, in accordance with an embodiment of the present invention. The first step in FIG. 9 copies the write transaction to the end of the DO stream and the end of the DO METADATA stream, as in the 5-stage journaling process. Unlike, the 5-stage journaling process, though, instead of reading write transaction data from the beginning of the DO and DO METADATA streams, the 4-stage journaling process takes advantage of the fact that the write transaction that was just received at the backup site is still resident in memory. For this write transaction, steps 3-5 are performed, as indicated in FIG. 9.

However, during the steps 3-5 distribution of the write transaction that was just received, it is possible that a new transaction arrives at the backup site. In order to keep pace with the arriving transaction, as each write transaction is entered into the ends of the DO and DO METADATA streams, the write transaction is written into the end of a queue in memory. In accordance with an embodiment of the present invention, the queue in memory is handled similar to the way the DO stream is handled; namely, each received write is appended to the end of the queue, and when a write transaction is distributed according to steps 3-5, a subsequent write transaction is taken from the beginning of the queue. Effectively, the queue corresponds to a cached DO stream.

The 4-stage journaling process is used until the queue in memory is full, at which point the normal 5-stage journal processing is resumed. Also in the event of a disaster, the normal 5-stage journal processing is resumed. In order to resume the 5-stage journal processing, it is important to identify the last write in the DO stream that was written. As such, even during the 4-stage journaling process, the pointers to the first and last write transactions in the DO stream are updated.

Conversely, when the I/O rate is high, in order to control the size of the DO stream and ensure that it does not overflow its disk allotment, the present invention switches from the normal 5-stage mode to a faster 3-stage mode whenever the DO stream reaches a large percentage of its maximum capacity, typically 80%. The present invention afterwards switches back from the faster 3-stage mode to the normal 5-stage mode whenever the DO stream is reduced to a smaller percentage of its maximum capacity, typically 75%.

The 3-stage mode eliminates steps 3 and 4 from the normal mode; namely, the steps that record the UNDO information. As such, rollback of the backup storage unit to its state at the times of those transactions processed with the 3-stage mode is not possible.

Figure 10:
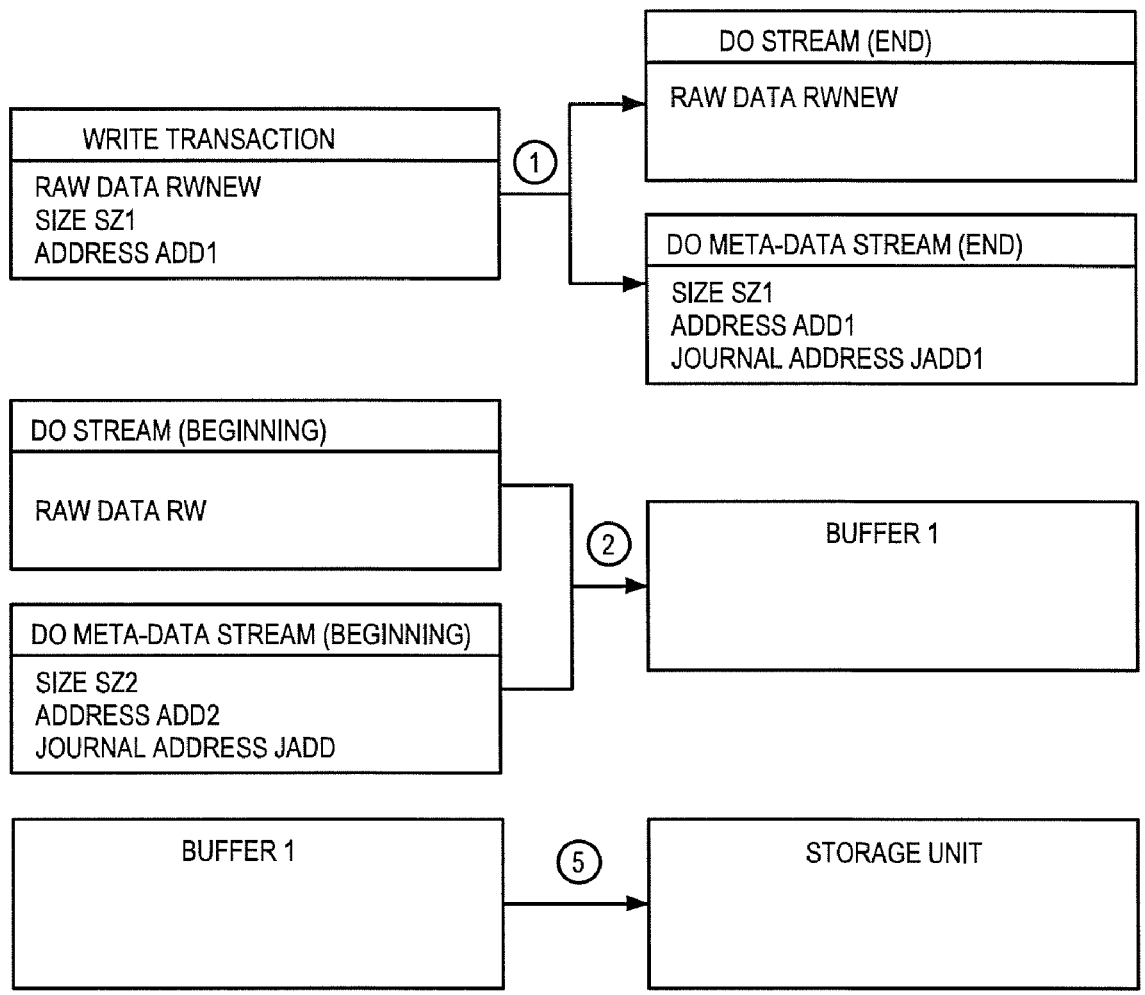
FIG. 10 is a simplified illustration of a three-stage journaling process for continuous data replication, for use when an I/O data rate is high, in accordance with an embodiment of the present invention.

Reference is now made to FIG. 10, which is a simplified illustration of a 3-stage journaling process for continuous data replication, for use when the DO stream is near its maximum capacity, in accordance with an embodiment of the present invention.

TABLE VII summarizes the relative pros and cons of each of the journaling processes described hereinabove.

TABLE VII

Pros and Cons of Journaling Processes

| Journaling Process | Pros | Cons |
| --- | --- | --- |
| 3-Stage Journaling | Fastest replication time | Long time to recover to current time |
| 4-Stage Journaling | Moderate replication time; Full data recovery capability | Only able to be used as long as the beginning and the end of the DO stream are close |
| 5-Stage Journaling | Full data recovery capability | Slowest replication time |

One data replication strategy is the set of automated rules for controlling when a data replication system transitions between 5-stage, 4-stage and 3-stage journal processing. As mentioned hereinabove, transitions from 5-stage to 3-stage journaling, and from 3-stage back to 5-stage journaling, may be controlled based on the current size of the DO stream. Transitions from 5-stage to 4-stage journaling may be automated to occur when the beginning and end of the DO stream are close; and transitions from 4-stage back to 5-stage journaling may be automated to occur when the memory queue reaches its capacity.

Figure 11:
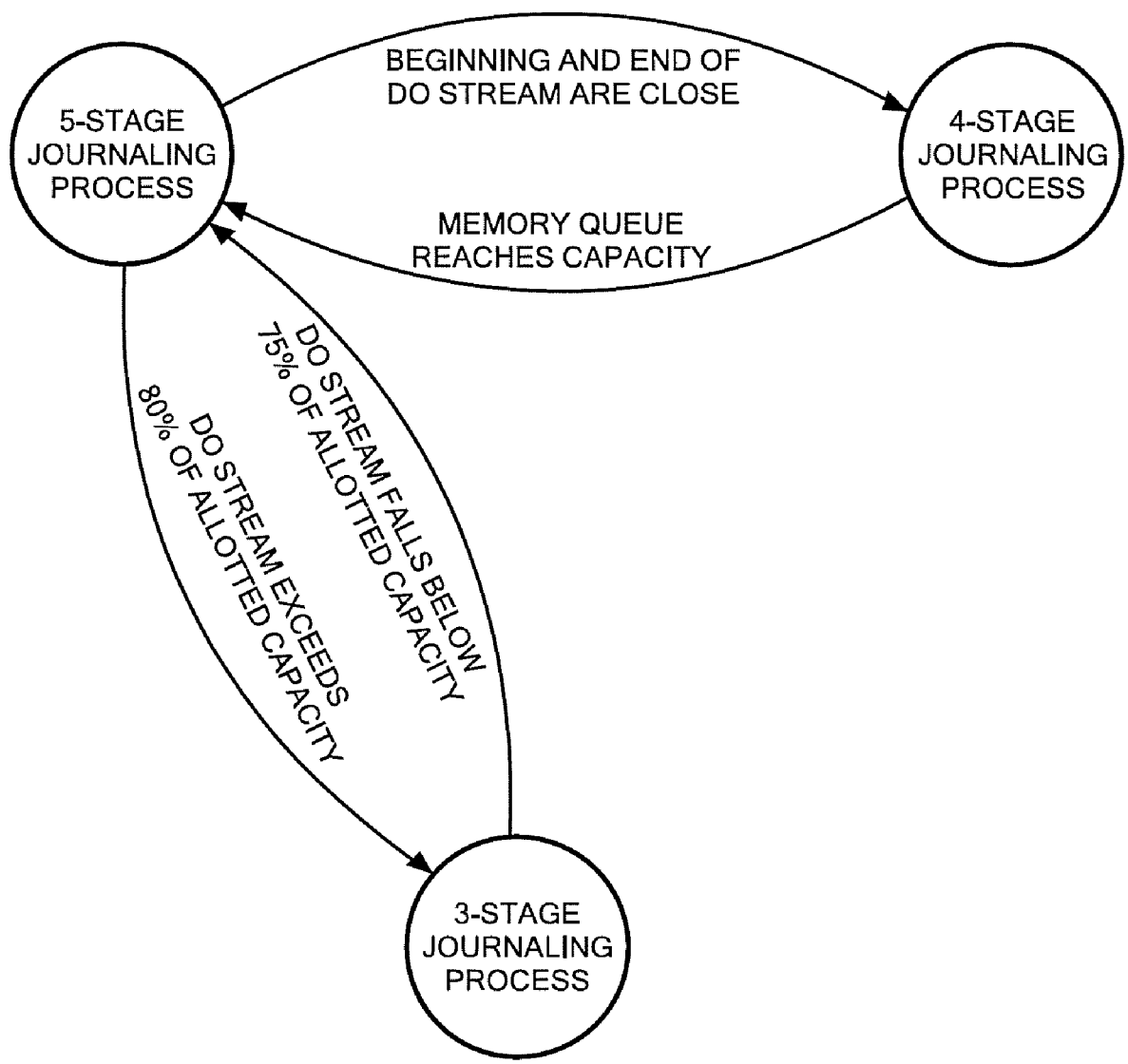
FIG. 11 is a simplified state diagram of transitions between 5-stage, 4-stage and 3-stage journal processing, in accordance with an embodiment of the present invention.

Reference is now made to FIG. 11, which is a simplified state diagram of transitions between 5-stage, 4-stage and 3-stage journal processing, in accordance with an embodiment of the present invention. Shown in FIG. 11 are three nodes, representing each of the journaling processes, and directed edges between the nodes corresponding to rules that govern transitions therebetween. As shown in FIG. 11, a 5-stage to 3-stage transition occurs when the size of the DO stream exceeds 80% of its allotted capacity, and a 3-stage to 5-stage transition occurs when the size of the DO stream falls under 75% of its allotted capacity. Similarly, a 5-stage to 4-stage transition occurs when the beginning and end of the DO stream are close; and a 4-stage to 5-stage transition occurs when the memory queue reaches its capacity.

It will be appreciated by those skilled in the art that using 4-stage journaling enables a data replication system to keep pace with higher I/O rates than can be handled when using 5-stage journaling. If the system is currently using 5-stage journaling and the I/O rate is higher than can be handled, a lag increases until the system necessarily transitions to the 3-stage journaling process. However, if the system can catch up with the lag, empty the DO stream and transition to a 4-stage journaling process, then the system can accommodate higher I/O rates before transitioning back to the 5-stage journaling process.

In this regard, it is noted that in general, if the system cannot keep pace with I/O rates using a 4-stage journaling process, then it most probably cannot keep pace using a 5-stage journaling process, and in either case the system would have to transition to a 3-stage journaling process. However, since the I/O rate changes continuously, a transition from 4-stage journaling to 5-stage journaling does not necessarily push the system to 3-stage journaling.

Figure 12:
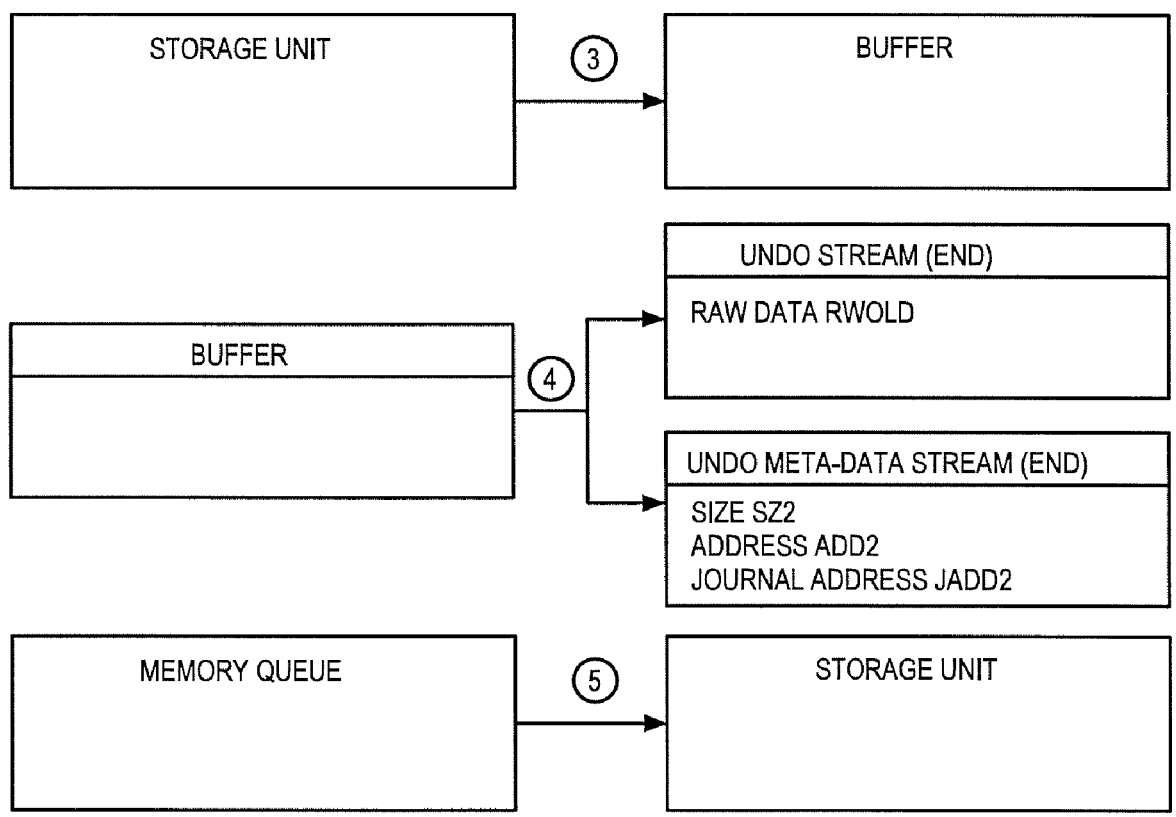
FIG. 12 is a simplified illustration of a variant of the three-stage journaling process shown in FIG. 10, which may be used in an alternative embodiment of the present invention.

Reference is now made to FIG. 12, which is a simplified illustration of a variant of the three-stage journaling process shown in FIG. 10, which may be used in an alternative embodiment of the present invention. The alternative 3-stage journaling proceeds according to the last three stages of the 4-stage journaling process. That is, the stage of writing to the DO stream is skipped within 4-stage journaling, for the alternative embodiment of 3-stage journaling. When performing 4-stage journaling, the backup site DPA (element 124 of FIG. 1) can return an acknowledgement to the production site DPA (element 112 of FIG. 1) immediately after the first stage, when the write transaction is written to the DO stream. However, when performing the alternative 3-stage journaling, the backup site DPA must wait until the write transaction is written to storage, before it can return an acknowledgement to the production site DPA. Since the last three stages of 4-stage journaling can be performed in a separate thread than the thread that performs the first stage, the alternative 3-stage journaling may result in a longer time lag between the source and target sites.

Described herein is a process to compress data. While the description focuses on compressing data within a data protection environment, the techniques described herein may be used in any data environment to compress data.

Figure 13:
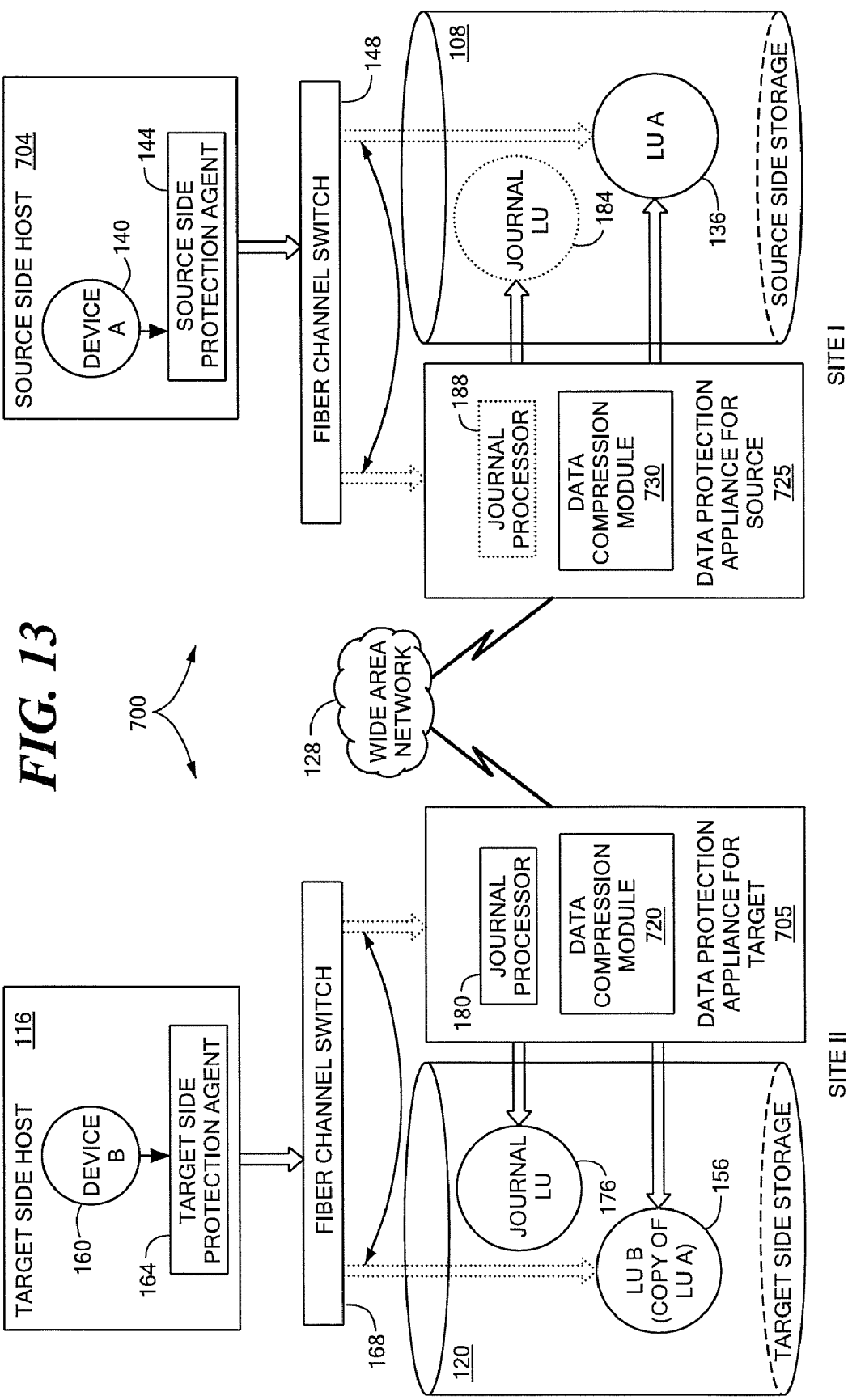
FIG. 13 is a simplified block diagram of another embodiment of a data protection system.

One aspect of the invention is a process to compress data as shown in FIG. 13. A data protection system 700 includes a source-side host 704 similar in functionality to the source-side host 104, for example. The data protection system 700 also includes a data protection appliance (DPA) 705 including a journal processor 710 and a data compression module (DCM) 720 used to compress data. In one example, the DCM 720 compresses data at the target side storage 156 (e.g., the LU B 156). In another example, the DCM module 720 compresses data at the source side storage (e.g., the LU A 136, the journal LU 184).

The data protection system 700 also includes a data protection appliance 725 having substantially the same components as the data protection appliance 705 (e.g., a journal processor 188 and a data compression module 730). While the description below describes using the target side data protection appliance 705 to compress data (e.g., the LU B 156) on the target side, the source side data protection appliance 725 may also be used to compress data on the target side.

In data protection systems, data may be saved once every second, for example, so that conserving processing time is critical. Also, in data protection systems, using less memory storage is also critical so that compressing data is also desired. However, the goal of reducing processing time and the goal of reducing storage space are two competing goals because compressing data can consume a significant amount of processing time. As described herein, the DCM 720 compresses some of the data twice using two different algorithms while other data is compressed once using one of the algorithms thereby saving significant processing time in compressing data.

In particular, the DCM 720 performs a relatively fast first compression algorithm that searches, for example, for longer repeats (i.e., repeats of data) than a second compression algorithm. For example, the first compression algorithm searches only for repeats larger than a first repeat threshold. For example, the first repeat threshold is 8 bytes or 16 bytes in the first compression algorithm. The first compression algorithm also does not search for repeats in every possible location but only those locations that start in an even location, for example, in the data stream. In other examples, instead of searching even locations, every 3 bytes or every 4 bytes are searched. In further examples, searches are done randomly every second byte on average, for example. Thus, the first compression algorithm is a faster compression algorithm because it searches much less data than the second compression algorithm as described below.

In one example, repeats are found in the data (e.g., using a LZ77 algorithm, a LZ78 and so forth) and the data (including the repeated and unrepeated data) is encoded using byte-alignment encoding (also referred to as byte-aligned encoding). For example, byte-alignment encoding includes uses a variable length code which is aligned to byte granularity.

The compressed data is checked to determine if there is a significant amount of compression after using the first compression algorithm. For example, if a compression ratio of the pre-compressed data to compressed data is greater than a compression threshold (e.g., for example, the compression ratio is greater than a compression threshold of 2), then a second compression algorithm, slower compared to the first compression algorithm, is used to further compress the compressed data.

Since the amount of repeats searched by the second compression algorithm is larger than the first compression algorithm, the second compression algorithm will be more effective. Since the data was previously compressed by at least a factor of 2 by the first compression algorithm, the second compression algorithm has much less data to compress. In general, the second compression algorithm is more aggressive in its search and will look for the longest repeat available in any location in the data, and the second compression algorithm will also accept repeats which are shorter than the first compression threshold (e.g., shorter than 8 bytes) unlike the first compression algorithm. For example, the second compression algorithm searches for any repeat as long as encoding the repeat as a repeat is more efficient than storing the data as it is originally provided to the second compression algorithm. The second compression algorithm also searches for repeats all over the data stream not just in the even locations as in the first compression algorithm.

The second compression algorithm may also search for repeats in several candidate locations in the data stream, and not just use only one search candidate as in the first compression algorithm. For example, in using the first compression algorithm, a hash function is calculates for 8 bytes of data, for example, and the first compression algorithm searches the previous location having the same hash whereas in using the second algorithm, pointer are kept to all locations in the data stream being compressed having the same hash value enabling finding the location with the longest repeat.

In one example, the second compression algorithm searches for repeats in the data compressed by the first algorithm, and compresses the data further (including the repeated and unrepeated data) using Huffman coding, for example. Otherwise, if there is not a significant amount of compression after using the first compression algorithm, then no further processing time is wasted trying to further compress the compressed data using the second compression algorithm.

Figure 14:
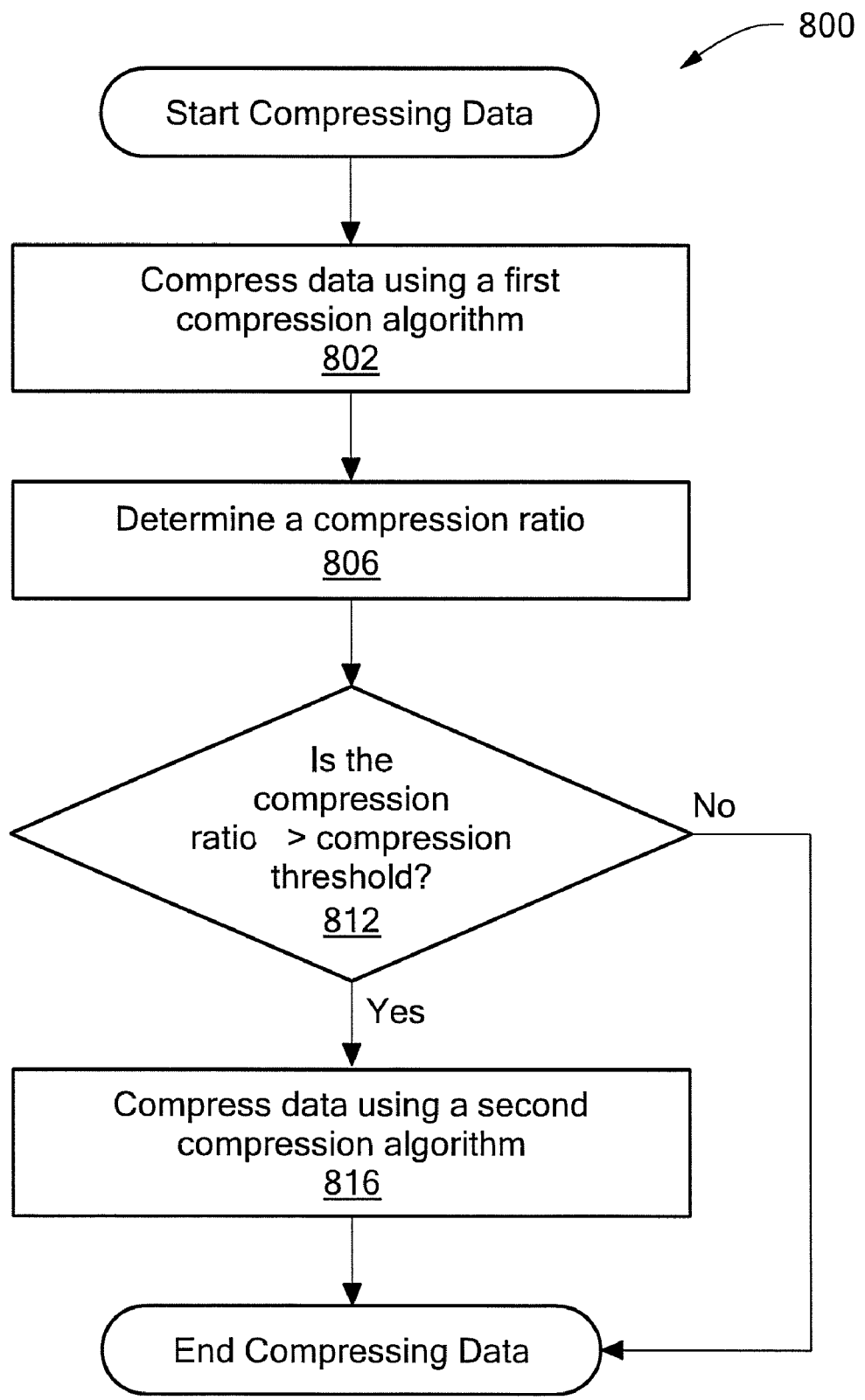
FIG. 14 is a flowchart of an example of a process to compress data.

Referring to FIG. 14, an example of a process to compress data is a process 800. The DCM 720 compresses data using a first compression algorithm (802). For example, the first compression algorithm searches for repeats greater than a first repeat threshold and searches for repeats only in locations in the data stream in which the offset is even in order to compress the data (e.g., using an LZ77 algorithm, an algorithm LZ78 and so forth). In one example, the first repeat threshold is 8 bytes. In another example, the first repeat threshold is 16 bytes. The first compression algorithm compresses the data (including the repeated and unrepeated data) using byte-aligned encoding, for example.

The DCM 720 determines the compression ratio of the uncompressed data to the compressed data (806) and determines if the compression ratio is greater than a compression threshold (812). In one example, the compression threshold is 2.

If the compression ratio is greater than the compression threshold, the compressed data is compressed again using a second compression algorithm (816). For example, the second compression algorithm searches for repeats greater than a second repeat threshold. For example, the second repeat threshold is 3 bytes. The second compression algorithm searches for the longest repeat available, but will encode a repeat as a repeat if the encoded length of encoding the data as a repeat is shorter than encoding the data as plain data. In one example, the second compression algorithm encodes data using Huffman coding.

Even though the second compression algorithm performs compression at a slower processing rate than the first compression algorithm, the second compression algorithm compresses the data better (i.e., has a better compression ratio) than the first compression algorithm. In another example, the second compression algorithm uses arithmetic coding to compress the data instead of Huffman coding.

If the compression ratio is less than the compression threshold, then the compressed data is not further compressed thereby saving a significant amount of processing time. Thus, using process 800 is faster in compressing the data than compressing all the data using just the second algorithm alone.

In one example, the first compression algorithm may be a QuickLZ algorithm or LZO algorithm and the second compression algorithm may be a GZIP algorithm.

Figure 15:
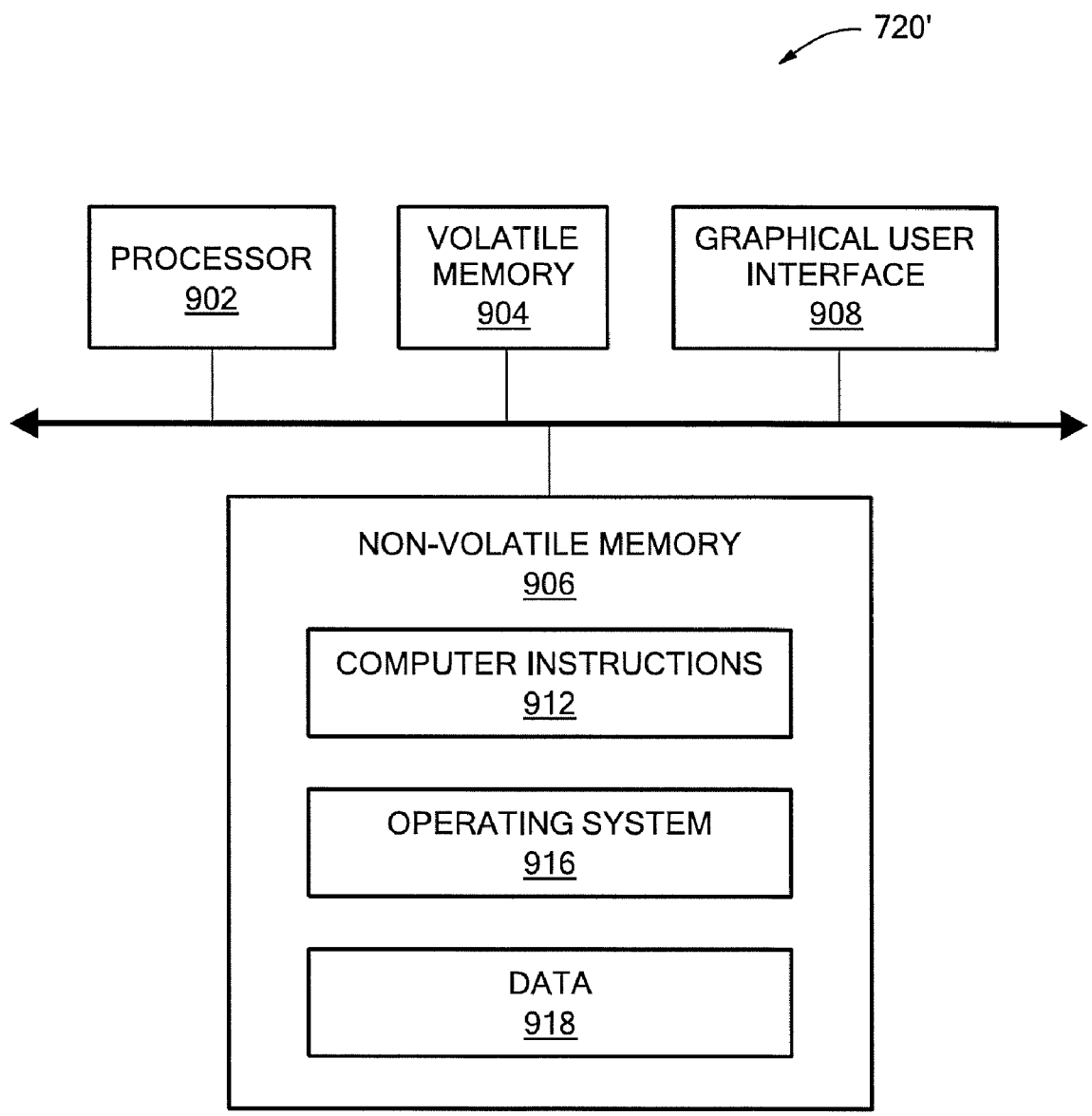
FIG. 15 is a computer on which the process of FIG. 14 may be implemented.

Referring to FIG. 15, an example of the data compression module 720 is a data compression module 720' which may be used to execute all or part of the process of 800. The compression module 720' includes a processor 902, a volatile memory 904 and a non-volatile memory 906 (e.g., hard disk), for example, and a graphical user interface 908 (e.g., a mouse, a keyboard, a touch screen and so forth). Non-volatile memory 906 includes an operating system 916, data 918 (e.g., compressed data, a compression threshold and so forth) and computer instructions 912 which are executed out of volatile memory 904 to perform all or part of process 800. In one example, the compression threshold may be selected by a user using the GUI 908. In other examples, the GUI 908 may be located anywhere within the data protection system 700 (e.g., at the source side host 704).

The processes described herein (e.g., process 800) are not limited to use with the hardware and software of FIG. 15; they may find applicability in any computing or processing environment and with any type of machine or set of machines that is capable of running a computer program. The processes may be implemented in hardware, software, or a combination of the two. The processes may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform process 800, for example, and to generate output information.

The processes described herein are not limited to the specific embodiments described herein. For example, the processes are not limited to the specific processing order of the processing blocks in FIG. 14. Rather, any of the processing blocks of FIG. 14 may be re-ordered, combined or removed, performed in parallel or in serial, as necessary, to achieve the results set forth above.

Processing blocks in FIG. 14 associated with implementing the system may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Elements of different embodiments described herein may be combined to form other embodiments not specifically set forth above. Other embodiments not specifically described herein are also within the scope of the following claims

What is claimed is:

1. A method to compress data, comprising:
   compressing data using a first algorithm to form compressed data;
   determining a compression ratio of the data with respect to the compressed data;
   determining if the compression ratio is greater than a compression threshold; and
   compressing the compressed data using a second algorithm if the compression ratio is greater than the compression threshold,
   wherein the second algorithm takes longer to compress data than the first algorithm,
   and
   wherein compressing data using a first algorithm comprises compressing data using a first algorithm that searches for repeats in the data stream which are greater than a first repeat threshold.

2. The method of claim 1 wherein compressing data using a first algorithm to form compressed data comprises compressing data using a QuickLZ algorithm, and
   wherein compressing the compressed data using a second algorithm comprises compressing the compressed data using a GZIP algorithm.

3. The method of claim 1 wherein compressing data using a first algorithm that searches for repeats in the data stream comprises compressing data using a first algorithm that searches for repeats in the data stream and start at an even alignment location.

4. The method of claim 1 wherein compressing data using a first algorithm comprises encoding data using byte-alignment coding.

5. The method of claim 1 wherein compressing the compressed data using a second algorithm comprises compressing the compressed data using a second algorithm that searches for repeats of any length in any alignment location.

6. The method of claim 5 wherein compressing the compressed data using a second algorithm comprises encoding the compressed data using Huffman coding.

7. The method of claim 5 wherein compressing data using a first algorithm comprises compressing data using a first algorithm comprises using an LZ77 algorithm, and
   wherein compressing the compressed data using a second algorithm comprises searching for using an LZ77 algorithm.

8. The method of claim 1 wherein determining if the compression ratio is greater than a compression threshold comprises determining if the compression ratio is greater than 2.

9. The method of claim 1, further comprising receiving the compression threshold from a user.

10. The method of claim 1 wherein compressing data using a first algorithm to form compressed data comprises compressing data being used in a data protection system.

11. The method of claim 1 wherein the second algorithm compresses data better compared to the first algorithm.

12. An apparatus to compress data, comprising:
    circuitry to:
    compress data using a first algorithm to form compressed data;
    determine a compression ratio of the data with respect to the compressed data;
    determine if the compression ratio is greater than a compression threshold; and
    compress the compressed data using a second algorithm if the compression ratio is greater than the compression threshold,
    wherein the second algorithm takes longer to compress data than the first algorithm,
    wherein the circuitry to compress data using a first algorithm comprises circuitry to compress data using a first algorithm that searches for repeats in the data stream which are greater than a first repeat threshold, and
    wherein the circuitry to compress the compressed data using a second algorithm comprises circuitry to compress the compressed data using a second algorithm that searches for repeats of any length in any alignment location.

13. The apparatus of claim 12 wherein the circuitry comprises at least one of a processor, a memory, programmable logic and logic gates in a data protection system.

14. The apparatus of claim 12 wherein the circuitry to compress data using a first algorithm comprises circuitry to encode data using byte-alignment coding, and
    wherein the circuitry to compress the compressed data using a second algorithm comprises circuitry to encode the compressed data using Huffman coding.

15. The apparatus of claim 14 wherein the circuitry to compress data using a first algorithm comprises circuitry to compress data using a first algorithm comprises circuitry to use an LZ77 algorithm, and
    wherein the circuitry to compress the compressed data using a second algorithm comprises circuitry to use an LZ77 algorithm.

16. The apparatus of claim 15 wherein the compression threshold is greater than 2.

17. An article comprising:
    a machine-readable medium that stores executable instructions to compress data in a data protection environment, the instructions causing a machine to:
    compress data using a first algorithm to form compressed data;
    determine a compression ratio of the data with respect to the compressed data;
    determine if the compression ratio is greater than a compression threshold of 2; and
    compress the compressed data using a second algorithm if the compression ratio is greater than 2,
    wherein the second algorithm takes longer to compress data than the first algorithm, wherein the instructions causing a machine to compress data using a first algorithm comprises instructions causing a machine to compress data using a first algorithm that searches for repeats in the data stream which are greater than a first repeat threshold, and wherein the instructions causing a machine to compress the compressed data using a second algorithm comprises instructions causing a machine to compress the compressed data using a second algorithm that searches for repeats of any length in any alignment location.

18. The article of claim 17 wherein the instructions causing a machine to compress data using a first algorithm comprises instructions causing a machine to encode data using byte-alignment coding, and wherein the instructions causing a machine to compress the compressed data using a second algorithm comprises circuitry to encode the compressed data using Huffman coding.

19. The article of claim 18 wherein the instructions causing a machine to compress data using a first algorithm comprises instructions causing a machine to use an LZ77 algorithm, and wherein the instructions causing a machine to compress the compressed data using a second algorithm comprises instructions causing a machine to use an LZ77 algorithm.

* * * * *